US012681119B2

(12) United States Patent　　(10) Patent No.:　US 12,681,119 B2

Kishore Kumar et al.　　(45) Date of Patent:　Jul. 14, 2026

(54) CIRCUIT WITH DYNAMIC CURRENT SENSE CALIBRATION

(71) Applicant: TEXAS INSTRUMENTS INCORPORATED, Dallas, TX (US)

(72) Inventors: Rushil Kishore Kumar, Bengaluru (IN); Jasjot Singh Chadha, Allen, TX (US); Atul Agrawal, Bengaluru (IN); Anand Kannan, Bengaluru (IN); Nikhil Goyal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 81 days.

(21) Appl. No.: 18/478,384

(22) Filed: Sep. 29, 2023

(65) Prior Publication Data

US 2024/0230815 A1　　Jul. 11, 2024

Related U.S. Application Data

(60) Provisional application No. 63/437,258, filed on Jan. 5, 2023.

(51) Int. Cl.
*G01R 35/00* (2006.01)
*G01R 19/25* (2006.01)
*H04R 29/00* (2006.01)

(52) U.S. Cl.
CPC .......... *G01R 35/005* (2013.01); *G01R 19/25* (2013.01); *H04R 29/001* (2013.01)

(58) Field of Classification Search
CPC .. G01R 35/005; G01R 19/25; G01R 19/0092; H04R 29/001; H04R 3/007
See application file for complete search history.

(56) References Cited

U.S. PATENT DOCUMENTS

| | | | | |
|---|---|---|---|---|
| 3,976,940 | A * | 8/1976 | Chau | G01R 19/16519 714/724 |
| 8,421,556 | B2 | 4/2013 | Chen | |
| 9,696,352 | B2 * | 7/2017 | Brown | G01R 19/25 |
| 10,107,873 | B2 | 10/2018 | Cesaretti | |
| 2011/0187345 | A1 * | 8/2011 | Karnik | G01R 35/005 324/74 |
| 2020/0393529 | A1 | 12/2020 | Larson | |
| 2022/0224348 | A1 | 7/2022 | Perrott | |
| 2024/0086347 | A1 * | 3/2024 | Mahmoodi | G06F 13/1694 |
| 2024/0329099 | A1 * | 10/2024 | Splithof | G01R 15/04 |

* cited by examiner

*Primary Examiner* — Akm Zakaria

(74) *Attorney, Agent, or Firm* — Xianghui Huang; Frank D. Cimino

(57) ABSTRACT

A circuit includes: a driver circuit; a sense resistor; a test circuit; a current sense circuit; a calibration controller; and a switch controller. The current sense circuit is configured to: obtain first sense signals responsive to a test voltage applied to the sense resistor by the test circuit, the test voltage being a direct-circuit voltage; and obtain second sense signals responsive a supply voltage applied to the sense resistor by the driver circuit, the supply voltage including a common-mode voltage. The calibration controller is configured to calibrate the current sense circuit responsive to the first sense signals and the second sense signals. The switch controller is configured to update switch control signals provided to the driver circuit responsive to current sense signals obtained by the calibrated current sense circuit.

12 Claims, 13 Drawing Sheets

CIRCUIT WITH DYNAMIC CURRENT SENSE CALIBRATION

CROSS-REFERENCE TO RELATED APPLICATIONS

The present application claims priority to U.S. Provisional Application No. 63/437,258, titled "Self-Calibration of Die-Stress and Aging Related Accuracy Errors Affecting Current-Sensing in Smart Class-D Amplifiers", filed on Jan. 5, 2023, which is hereby incorporated by reference in its entirety. The present application is also related to: U.S. application Ser. No. 18/478,431, titled "RESISTOR DRIFT CALIBRATION", filed on Sep. 29, 2023, which is hereby incorporated by reference in its entirety.

BACKGROUND

Many sense circuits are subject to aging or stress-induced error. Accordingly, an initial design or calibration for such sense circuits eventually produces less accurate results and may even fall out of a target tolerance. An example sense circuit calibration involves tuning a common-mode rejection ratio (CMRR). An example of stress-induced error is that an initial CMRR tuning may be degraded once an integrated circuit (IC) chip has been soldered to an end-product printed-circuit board (PCB). For some sense applications, such changes may be unacceptable.

SUMMARY

In an example, a circuit includes: a driver circuit; a test circuit; a sense resistor; a current sense circuit; a calibration controller; and a switch controller. The driver circuit has a first terminal, a second terminal, a third terminal, and a fourth terminal. The sense resistor having a first terminal and a second terminal. The first terminal of the sense resistor coupled to the fourth terminal of the driver circuit. The test circuit has a first terminal, a second terminal, a third terminal, and a fourth terminal. The first terminal of the test circuit is coupled to the third terminal of the driver circuit. The second terminal of the test circuit is coupled to the fourth terminal of the driver circuit. The current sense circuit has a first terminal, a second terminal, a third terminal, a fourth terminal, and a fifth terminal. The first terminal of the current sense circuit is coupled to the first terminal of the sense resistor. The second terminal of the current sense circuit is coupled to the second terminal of the sense resistor. The calibration controller has a first terminal, a second terminal, and a third terminal. The first terminal of the calibration controller is coupled to the fourth terminal of the current sense circuit. The second terminal of the calibration controller is coupled to the fourth terminal of the test circuit. The third terminal of the calibration controller is coupled to the third terminal of the current sense circuit. The switch controller has a first terminal and a second terminal. The first terminal of the switch controller is coupled to the fifth terminal of the current sense circuit. The second terminal of the switch controller is coupled to the first terminal of the driver circuit.

In another example, a system includes: a speaker; and an amplifier circuit coupled to the speaker. The amplifier circuit includes: a driver circuit; a test circuit; a sense resistor; a current sense circuit; a calibration controller; and a switch controller. The test circuit is coupled to the driver circuit. The sense resistor has a first terminal and a second terminal. The first terminal of the sense resistor is coupled to the driver circuit. The current sense circuit is coupled to the first and second terminals of the sense resistor and is configured to: obtain first sense signals responsive to a test voltage applied to the sense resistor by the test circuit, the test voltage being a direct-circuit voltage; and obtain second sense signals responsive a supply voltage applied to the sense resistor by the driver circuit, the supply voltage including a common-mode voltage. The calibration controller is coupled to the current sense circuit and is configured to calibrate the current sense circuit responsive to the first sense signals and the second sense signals. The switch controller is coupled to the driver circuit and is configured to update switch control signals provided to the driver circuit responsive current sense signals obtained by the calibrated current sense circuit.

In yet another example, a method comprises: obtaining first sense signals responsive to a test voltage applied to a sense resistor, the test voltage being a direct-circuit voltage; obtaining second sense signals responsive a supply voltage applied to the sense resistor, the supply voltage including a common-mode voltage; calibrating a current sense circuit responsive to the first sense signals and the second sense signals; and updating switch control signals to responsive to current sense signals obtained by the calibrated current sense circuit.

BRIEF DESCRIPTION OF THE DRAWINGS

FIG. 6 is a timing diagram showing example current sense calibration operations.

DETAILED DESCRIPTION

Figure 1:
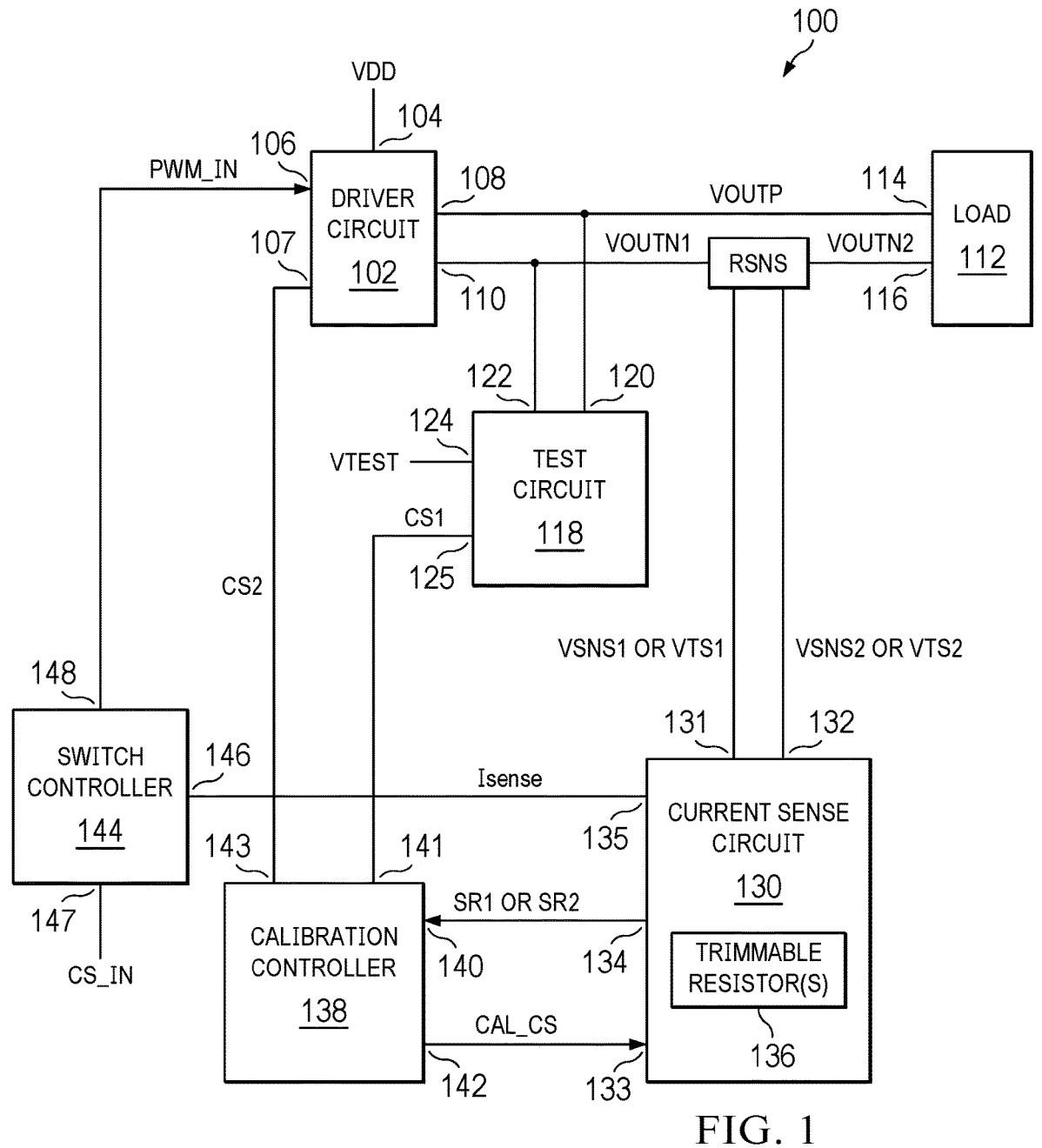
FIG. 1 is a diagram showing an example system.

The same reference numbers or other reference designators are used in the drawings to designate the same or similar features. Such features may be the same or similar either by function and/or structure.

FIG. 1 is a diagram showing an example system 100. In the example of FIG. 1, the system 100 includes a driver circuit 102, a sense resistor RSNS, a load 112, a test circuit 118, a current sense circuit 130, a calibration controller 138, and a switch controller 144. The driver circuit 102 has a first terminal 104, a second terminal 106, a third terminal 107, a fourth terminal 108, and a fifth terminal 110. The sense resistor RSNS has a first terminal and a second terminal. The load 112 has a first terminal 114 and a second terminal 116.

The test circuit 118 has a first terminal 120, a second terminal 122, a third terminal 124, and a fourth terminal 125. The current sense circuit 130 has a first terminal 131, a second terminal 132, a third terminal 133, a fourth terminal 134, and a fifth terminal 135. The current sense circuit 130 includes trimmable resistor(s) 136. As used herein, a "trimmable resistor" refers to a resistor whose resistance value can be dynamically adjusted or programmed. In some examples, the value of the trimmable resistor(s) 136 can be adjusted periodically as needed to account for drift over time. The calibration controller 138 has a first terminal 140, a second terminal 141, a third terminal 142, and a fourth terminal 143. The switch controller 144 has a first terminal 146, second terminal(s) 147, and a third terminal 148.

In the example of FIG. 1, the first terminal 104 of the driver circuit 102 is coupled to a supply voltage (VDD) source (not shown). The second terminal 106 of the driver circuit 102 is coupled to the third terminal 148 of the switch controller 144. The third terminal 107 of the driver circuit 102 is coupled to the fourth terminal 143 of the calibration controller 138. The fourth terminal 108 of the driver circuit 102 is coupled to the first terminal 114 of the load 112 and to the first terminal 120 of the test circuit 118. The fifth terminal 110 of the driver circuit 102 is coupled to the first terminal of the sense resistor RSNS, the first terminal 131 of the current sense circuit 130, and the second terminal 122 of the test circuit 118. The second terminal of the sense resistor RSNS is coupled to the second terminal 116 of the load 112 and the second terminal 132 of the current sense circuit 130. The third terminal 124 of the test circuit 118 is coupled to a test voltage (VTEST) source (not shown). The fourth terminal 125 of the test circuit 118 is coupled to the second terminal 141 of the calibration controller 138. The third terminal 133 of the current sense circuit 130 is coupled to the third terminal 142 of the calibration controller 138. The fourth terminal 134 of the current sense circuit 130 is coupled to the first terminal 140 of the calibration controller 138. The fifth terminal 135 of the current sense circuit 130 is coupled to the first terminal 146 of the switch controller 144. The second terminal(s) 147 of the switch controller 144 is coupled to a source (not shown) of input control signals (CS_IN).

The driver circuit 102 operates to: receive VDD at its first terminal 104; receive PWM_IN at its second terminal 106; receive a control signal (CS2) at its third terminal 107; provide a first output voltage (VOUTP) at its fourth terminal 108 responsive to VDD as well as PWM_IN or CS2; and provide a second output voltage (VOUTN1) at its fifth terminal 110 responsive to VDD as well as PWM_IN or CS2. In the example of FIG. 1, there is a voltage drop across the sense resistor RSNS, such that VOUTN1 is at the first terminal of the sense resistor, and a lesser voltage (VOUTN2) is at the second terminal of the sense resistor RSNS. During some calibration intervals involving VDD and the driver circuit 102, the voltage at the first terminal of the sense resistor RSNS is referred to herein as VSNS1 and the voltage at the second terminal of the sense resistor RSNS is referred to herein as VSNS2.

The load 112 operates to: receive VOUTP at its first terminal 114; receive VOUTN2 at its second terminal 116; and perform load operations responsive to VOUTP and VOUTN2. In some examples, the load 112 is a speaker, where VOUTP and VOUTN2 control the volume of the speaker.

During some calibration intervals, the test circuit 118 operates to: receive a test voltage (VTEST) at its third terminal 124; receive a control signal (CS1) at its fourth terminal 125; provide VTEST at its first terminal 120 responsive to CS1; and provide VTEST at its second terminal 122 responsive to CS1. During calibration intervals involving VTEST and the test circuit 118, the voltage at the first terminal of the sense resistor RSNS is referred to herein as VTS1 and the voltage at the second terminal of the sense resistor RSNS is referred to herein as VSNS2.

During normal operations (e.g., outside of calibration intervals), the current sense circuit 130 operates to: receive VSNS1 at its first terminal 131; receive VSNS2 at its second terminal 132; and provide a current sense signal (Isense) at its fifth terminal 135 responsive VSNS1 and VSNS2. If a calibration was previously performed and a calibration control signal (CAL_CS) was previously received at its third terminal 133 of the current sense circuit 130, Isense is also based on CAL_CS. During calibration intervals that use the driver circuit 102, the current sense circuit 130 operates to: receive VSNS1 at its first terminal 131; receive VSNS2 at its second terminal 132; and provide first sense results (SR1) at its fifth terminal 135 responsive to VSNS1, VSNS2, and CAL_CS (if a calibration was performed previously). During calibration intervals that use the test circuit 118, the current sense circuit 130 operates to: receive VTS1 at its first terminal 131; receive VTS2 at its second terminal 132; and provide second sense results (SR2) at its fifth terminal 135 responsive to VTS1, VTS2, and CAL_CS (if a calibration was performed previously).

The calibration controller 138 operates to: provide CS1 at its second terminal 141 for calibration intervals that use the driver circuit 102; receive SR1 at its first terminal 140 during calibration intervals that use the driver circuit 102; provide CS2 at its fourth terminal 143 for calibration intervals that use the test circuit 118; receive SR2 at its first terminal 140 during calibration intervals that use the test circuit 118; and provide CAL_CS at its third terminal 142 responsive to SR1 and SR2. In some examples, operations of the calibration controller 138 may also be responsive to Isense from the current sense circuit 130. In some examples, during calibration intervals that use the driver circuit 102, CS2 controls switches of the driver circuit 102 so that a voltage based on VDD is applied to the sense resistor RSNS. During calibration intervals that use the test circuit 118, CS1 control switches of the test circuit 118 so that a voltage based on VTEST is applied to the sense resistor RSNS. In some examples, the calibration controller 138 may provide additional control signals to the test circuit 118 and/or the driver circuit 102 to control calibration operations using the test circuit 118 and/or the driver circuit 102.

The switch controller 144 operates to: receive Isense at its first terminal 146; receive CS_IN at its second terminal(s) 147; and provide PWM_IN at its third terminal 148 responsive to Isense and CS_IN. In some examples, CS_IN may include an audio signal input, a test-mode parameter to test the driver switch resistances, control signals from the calibration controller 138 to control the switch controller 144 during calibration intervals, and/or other control signals. In some examples, the switch controller 144 uses Isense to: estimate a resistivity and/or temperature of the load 112; and adjust PWM_IN responsive to the estimated resistivity and/or temperature.

Figure 2:
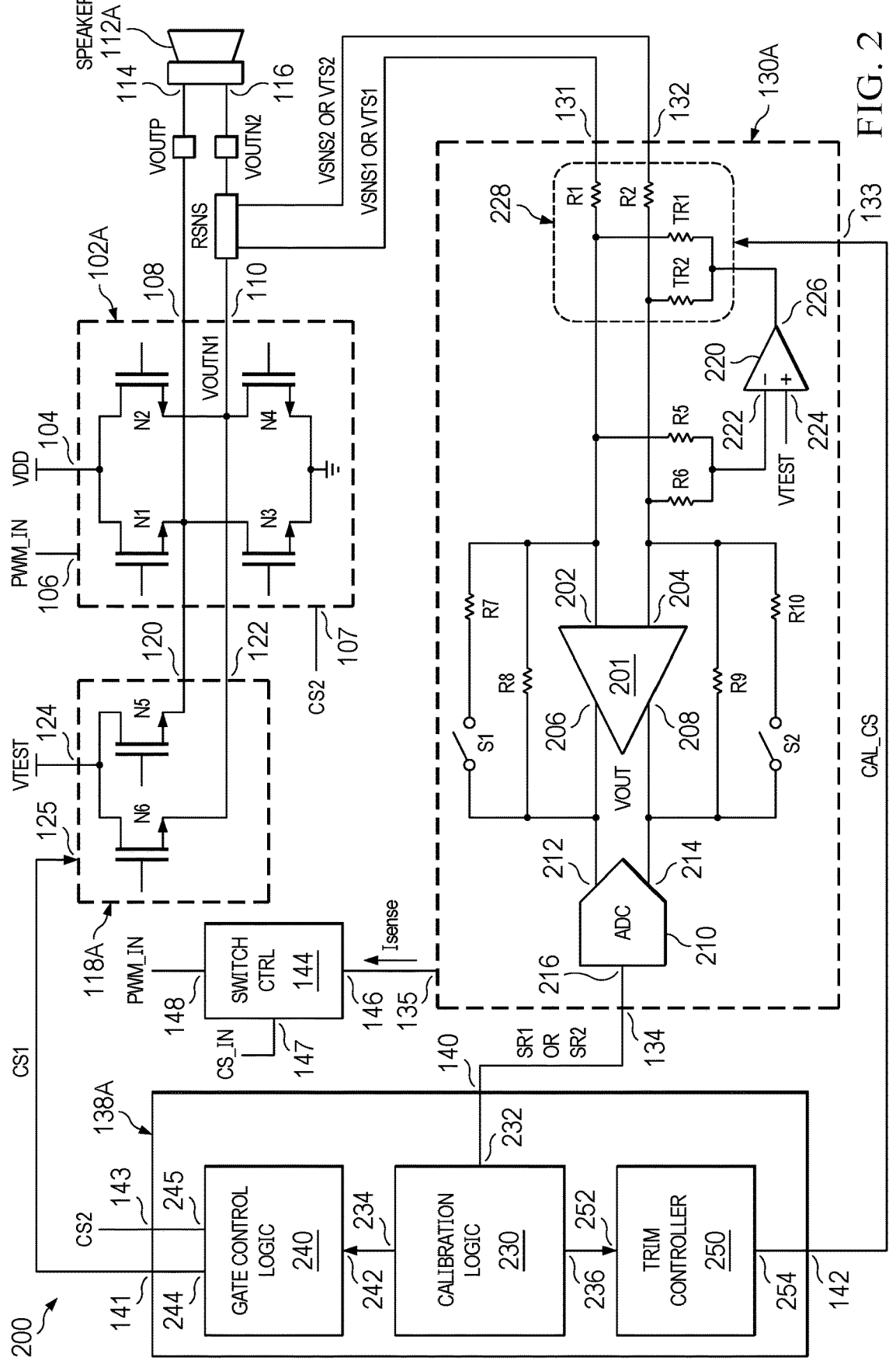
FIG. 2 is a diagram showing another example system.

FIG. 2 is a diagram showing another example system 200. The system 200 is an example of the system 100 in FIG. 1. In the example of FIG. 2, the system 200 includes a driver circuit 102A, the sense resistor RSNS, a speaker 112A, a test circuit 118A, a current sense circuit 130A, a calibration controller 138A, and the switch controller 144. The driver circuit 102A is an example of the driver circuit 102 in FIG.

1. The speaker 112A is an example of the load 112 in FIG. 1. The test circuit 118A is an example of the test circuit 118 in FIG. 1. The current sense circuit 130A in an example of the current sense circuit 130 in FIG. 1. The calibration controller 138A is an example of the calibration controller 138 in FIG. 1.

The driver circuit 102A has the first terminal 104, the second terminal 106, the third terminal 107, the fourth terminal 108, and the fifth terminal 110. The speaker 112A has the first terminal 114 and the second terminal 116. The test circuit 118A has the first terminal 120, the second terminal 122, the third terminal 124, and the fourth terminal 125. The current sense circuit 130A has the first terminal 131, the second terminal 132, the third terminal 133, the fourth terminal 134, and the fifth terminal 135. The calibration controller 138A has the first terminal 140, the second terminal 141, the third terminal 142, and the fourth terminal 143.

In the example of FIG. 2, the driver circuit 102A includes transistors N1 to N4 in the arrangement shown. Each of the transistors N1 to N4 is an n-channel metal-oxide semiconductor (NMOS) transistor having a respective first terminal, a respective second terminal, and a respective control terminal.

In the example of FIG. 2, the test circuit 118A includes transistors N5 and N6, in the arrangement shown. Each of the transistors N5 and N6 is an NMOS transistor having a respective first terminal, a respective second terminal, and a respective control terminal.

In the example of FIG. 2, the current sense circuit 130A includes an operational amplifier 201, an analog-to-digital converter (ADC) 210, switches S1 and S2, resistors R1, R2, R4 to R10, trimmable resistors TR1 and TR2, and an input common-mode regulating amplifier 220 in the arrangement shown. The trimmable resistors TR1 and TR2 are examples of the trimmable resistor(s) 136 in FIG. 1. The operational amplifier 201 has a first terminal 202, a second terminal 204, a third terminal 206, and a fourth terminal 208. The ADC 210 has a first terminal 212, a second terminal 214, and a third terminal 216. Each of the switches S1 and S2 has a respective first terminal, a respective second terminal, and a respective control terminal. In the example of FIG. 2, the resistors R1 and R2, and the trimmable resistors TR1 and TR2 are part of a trimmable resistance network 228. With the trimmable resistance network 228: the resistance between the first terminal 131 of the current sense circuit 130A and the first terminal 202 of the operational amplifier 201 is adjustable; and the resistance between the second terminal 132 of the current sense circuit 130A and the second terminal 204 of the operational amplifier 201 is adjustable. Without limitation, in the example of FIG. 2, the trimmable resistance network 228 includes two voltage dividers, each having a trimmable resistor. In other examples, the arrangement and/or components of the trimmable resistance network 228 may vary.

In the example of FIG. 2, each of the resistors R1, R2, and R4 to R10 has a respective first terminal and a respective second terminal. Each of the trimmable resistors TR1 and TR2 has a respective first terminal and a respective second terminal. The input common-mode regulating amplifier 220 has a first terminal 222, a second terminal 224, and a third terminal 226. In the example of FIG. 2, the first terminal 222 of the input common-mode regulating amplifier 220 is an inverting ("−") terminal, and the second terminal 224 of the input common-mode regulating amplifier 220 is a non-inverting ("+") terminal.

In the example of FIG. 2, the calibration controller 138A includes calibration logic 230, gate control logic 240, and a trim controller 250. The calibration logic 230 has a first terminal 232, a second terminal 234, and a third terminal 236. The gate control logic 240 has a first terminal 242, a second terminal 244, and a third terminal 245. The trim controller 252 has a first terminal 252 and a second terminal 254.

As shown, the first terminal 104 of the driver circuit 102A is coupled to the VDD source (not shown). The second terminal 106 of the driver circuit 102A is coupled to the third terminal 148 of the switch controller 144. The third terminal 107 of the driver circuit 102A is coupled to the fourth terminal 143 of the calibration controller 138A. The fourth terminal 108 of the driver circuit 102A is coupled to the first terminal 114 of the speaker 112A and to the first terminal 120 of the test circuit 118A. The fifth terminal 110 of the driver circuit 102A is coupled to the first terminal of the sense resistor RSNS, the second terminal 122 of the test circuit 118A, and the first terminal 131 of the current sense circuit 130A. The second terminal of the sense resistor RSNS is coupled to the second terminal 116 of the speaker 112A and to the second terminal 132 of the current sense circuit 130A. The third terminal 124 of the test circuit 118A is coupled to a VTEST source (not shown). The fourth terminal 125 of the test circuit 118A is coupled to the second terminal 141 of the calibration controller 138. The third terminal 133 of the current sense circuit 130A is coupled to the third terminal 142 of the calibration controller 138A. The fourth terminal 134 of the current sense circuit 130A is coupled to the first terminal 140 of the calibration controller 138A. The fifth terminal 135 of the current sense circuit 130A is coupled to the first terminal 146 of the switch controller 144. The second terminal(s) 147 of the switch controller 144 is coupled to a CS_IN source (not shown).

The first terminal 104 of the driver circuit 102A is coupled to the first terminals of the transistors N1 and N2. The second terminal of the transistor N1 is coupled to the first terminal of the transistor N3 and to the fourth terminal 108 of the driver circuit 102A. The second terminal of the transistor N3 is coupled to a ground terminal or ground. The second terminal of the transistor N2 is coupled to the first terminal of the transistor N4 and to the fifth terminal 110 of the driver circuit 102A. The second terminal of the transistor N4 is coupled to a ground terminal or ground. In some examples, the control terminals of the transistors N1, N2, N3, and N4 are controlled based on one or more PWM schemes. In one example, the control terminals of the transistors N1 and N4 are coupled to the second terminal 106 of the driver circuit 102 for control by PWM_IN. In this example, the control terminals of the transistors N2 and N3 are coupled to a PWM_INZ source (e.g., the output of an inverter coupled to the second terminal 106 of the driver circuit 102). In other examples, the control of the transistors N1 to N4 may vary.

The third terminal 124 of the test circuit 118A is coupled to the first terminals of the transistors N5 and N6. The second terminal of the transistor N5 is coupled to the first terminal 120 of the test circuit 118A. The second terminal of the transistor N6 is coupled to the second terminal 122 of the test circuit 118A. In some examples, the control terminals of the transistors N5 and N6 are coupled to the fourth terminal 125 of the test circuit 118A.

Regarding the current sense circuit 130A, the first terminal 131 of the current sense circuit 130A is coupled to the first terminal of the resistor R1. The second terminal of the resistor R1 is coupled to the first terminal of the resistor TR1 and to the first terminal 202 of the operational amplifier 201. The second terminal of the resistor TR1 is coupled to the third terminal 226 of the input common-mode regulating amplifier 220. The first terminal 202 of the operational amplifier 201 is also coupled to the first terminal of the resistor R6 and to the first terminal of the resistor R7. The second terminal of the resistor R6 is coupled to the third terminal 206 of the operational amplifier 201. The second terminal of the resistor R7 is coupled to the first terminal of the switch S1. The second terminal of the switch S1 is coupled to the fourth terminal 208 of the operational amplifier 201.

In some examples, the control terminal of the switch S1 is coupled to the calibration logic 230. In such examples, the calibration logic 230 may turn off (e.g., open) the switch S1 during calibration intervals to increase the gain of the operational amplifier 201 and thereby improve current sense trim resolution. During normal operations, the switch S1 may be turned on (e.g., closed), which provides a target gain for the operational amplifier 201. In this example, the target gain for the operational amplifier 201 during normal current sense operations is less than the gain of the operational amplifier 201 during calibration intervals.

The second terminal 132 of the current sense circuit 130A is coupled to the first terminal of the resistor R2. The second terminal of the resistor R2 is coupled to the first terminal of the resistor TR2 and to the second terminal 204 of the operational amplifier 201. The second terminal of the trim-mable resistor TR2 is coupled to the third terminal 226 of the input common-mode regulating amplifier 220. The second terminal 204 of the operational amplifier 201 is also coupled to the first terminal of the resistor R9 and to the first terminal of the resistor R10. The second terminal of the resistor R9 is coupled to the fourth terminal 208 of the operational amplifier 201. The second terminal of the resistor 10 is coupled to the first terminal of the switch S2. The second terminal of the switch S2 is coupled to the fourth terminal 208 of the operational amplifier 201.

In some examples, the control terminal of the switch S2 is coupled to the calibration logic 230. In such examples, the calibration logic 230 may turn off (e.g., open) the switch S2 during calibration intervals to increase the gain of the operational amplifier 201 and thereby improve current sense trim resolution. During normal operations, the switch S2 may be turned on (e.g., closed), which provides a target gain for the operational amplifier 201. In this example, the target gain for the operational amplifier 201 during normal current sense operations is less than the gain of the operational amplifier 201 during calibration intervals. In the example of FIG. 2, the third terminal 206 of the operational amplifier 201 is coupled to the first terminal 212 of the ADC 210. The fourth terminal 208 of the operational amplifier 201 is coupled to the second terminal 214 of the ADC 210. The third terminal 216 of the ADC 210 is coupled to the fourth terminal 134 of the current sense circuit 130A.

Regarding the calibration controller 138A, the first terminal 232 of the calibration logic 230 is coupled to the first terminal 140 of the calibration controller 138A. The second terminal 234 of the calibration logic 230 is coupled to the first terminal 242 of the gate control logic 240. The third terminal 236 of the calibration logic 230 is coupled to the first terminal 252 of the trim controller 250. The second terminal 244 of the gate control logic 240 is coupled to the second terminal 141 of the calibration controller 138A. The second terminal 254 of the trim controller 250 is coupled to the third terminal 142 of the calibration controller 138A. The third terminal 245 of the gate control logic 240 is coupled to the fourth terminal 143 of the calibration controller 138A.

The driver circuit 102A operates to: receive VDD at its first terminal 104; receive PWM_IN at its second terminal 106; received CS2 at its third terminal 107; provide VOUTP at its fourth terminal 108 responsive to VDD, PWM_IN or CS2, and the operations of the transistors N1 to N4; and provide VOUTN1 at its fifth terminal 110 responsive to VDD, PWM_IN or CS2, and the operations of the transistors N1 to N4. In some examples, PWM_IN is used to control N1 and N4, and an inverse control signal (PWM_INZ) derived from PWM_IN is used to control N2 and N3. In other examples, the control scheme for the transistors N1 to N4 may vary. During normal operations PWM_IN (and/or related signals such as the inverse of PWM_IN) is used to control the transistors N1 to N4 of the driver circuit 102A. During some calibration operations, CS2 (and/or related signals such as the inverse of PWM_IN) is used to control the transistors N1 to N4 of the driver circuit 102A. In some examples, CS2 enables switch control operations similar to PWM_IN. In the example of FIG. 2, there is a voltage drop across the sense resistor RSNS, such that VOUTN1 is at the first terminal of the sense resistor RSNS, and VOUTN2 is at the second terminal of the sense resistor RSNS. During calibration intervals that use the driver circuit 102A, the voltage at the first terminal of the sense resistor RSNS is referred to herein as VSNS1, and the voltage at the second terminal of the sense resistor RSNS is referred to herein as VSNS2.

The speaker 112A operates to: receive VOUTP at its first terminal 114; receive VOUTN2 at its second terminal 116; and perform speaker operations responsive to VOUTP and VOUTN2. In some examples, VOUTP and VOUTN2 control the volume of the speaker 112A.

During some calibration intervals, the test circuit 118A operates to: receive VTEST at its third terminal 124; receive CS1 at its fourth terminal 125; provide VTEST at its first terminal 120 responsive to CS1 and the operation of the transistor N6; and provide VTEST at its second terminal 122 responsive to CS1 and the operation of the transistor N5. During calibration intervals that use the test circuit 118A, the voltage at the first terminal of the sense resistor RSNS is referred to herein as VTS1 and the voltage at the second terminal of the sense resistor RSNS is referred to herein as VSNS2.

During normal operations, the current sense circuit 130A operates to: receive VSNS1 at its first terminal 131; receive VSNS2 at its second terminal 132; and provide Isense at its fifth terminal 135 responsive VSNS1 and VSNS2. In some examples, the current sense circuit 130 operates to: amplify the differential signal generated across the sense resistor RSNS; and shift the differential signal from a high-voltage domain to low-voltage domain for compatibility with other circuitry such as the ADC 210.

During normal operations (e.g., outside of calibration intervals), the current sense circuit 130A operates to: receive VSNS1 at its first terminal 131; receive VSNS2 at its second terminal 132; and provide Isense at its fifth terminal 135 responsive VSNS1 and VSNS2. If a calibration was previously performed and CAL_CS was previously received at its third terminal 133 of the current sense circuit 130A, Isense is also based on CAL_CS. During calibration intervals that use the driver circuit 102A, the current sense circuit 130A operates to: receive VSNS1 at its first terminal 131; receive VSNS2 at its second terminal 132; and provide SR1 at its fifth terminal 135 responsive to VSNS1, VSNS2, and CAL_CS if available). During calibration intervals that use the test circuit 118, the current sense circuit 130 operates to: receive VTS1 at its first terminal 131; receive VTS2 at its second terminal 132; and provide SR2 at its fifth terminal 135 responsive to VTS1, VTS2, and CAL_CS (if available).

During some calibration intervals, the current sense circuit 130A operates to: receive VSNS1 at its first terminal 131; receive VSNS2 at its second terminal 132; provide SR1 at its fifth terminal 135 responsive to VSNS1, VSNS2, the operations of the voltage divider formed by the resistor R1 and the trimmable resistor TR1, the operations of the voltage divider formed by the resistor R2 and the trimmable resistor TR2, the operations of the operational amplifier 201, the operations of the feedback loops formed using the resistors R8, R7, and the switch S1, the operations of the feedback loops formed using the resistors R10, R9, and the switch S2, and the operations of the ADC 210. During other calibration intervals, the current sense circuit 130A operates to: receive VTS1 at its first terminal 131; receive VTS2 at its second terminal 132; and provide SR2 at its fifth terminal 135 responsive to VTS1, VTS2, the operations of the voltage divider formed by the resistor R1 and the trimmable resistor TR1, the operations of the voltage divider formed by the resistor R2 and the trimmable resistor TR2, the operations of the operational amplifier 201, the operations of the feedback loops formed using the resistors R8, R7, and the switch S1, the operations of the feedback loops formed using the resistors R10, R9, and the switch S2, and the operations of the ADC 210.

The resistors R5 and R6, and the input common-mode regulating amplifier 220 operate to perform common-mode rejection operations. Example common-mode rejection operations involve regulating the voltage at the first terminal 202 and the second terminal 204 of the operational amplifier 201 so that the operational amplifier 201 is not affected by common-mode changes at the first terminal 131 and the second terminal 132 of the current sense circuit 130A. The resistor R5 and R6 carry the common-mode current flowing through the first terminal 131 and the second terminal 132 of the current sense circuit 130A for regulation by the input common-mode regulating amplifier 220.

The calibration controller 138A operates to: provide CS1 at its second terminal 141 for calibration intervals that use the driver circuit 102; receive SR1 at its first terminal 140 during calibration intervals that use the driver circuit 102A; provide CS2 at its fourth terminal 143 for calibration intervals that use the test circuit 118A; receive SR2 at its first terminal 140 during calibration intervals that use the test circuit 118A; and provide CAL_CS at its third terminal 142 responsive to SR1, SR2, the operations of the calibration logic 230, and the operations of the trim controller 250. In some examples, the calibration logic 230 operates to control VOUTP and VOUTN1 during the calibration phases using the gate control logic 240. The trim controller 250 operates to: receive control signals at its first terminal 252; and provide CAL_CS at its second terminal 254 responsive to the control signals. In some examples, operations of the calibration controller 138A may also be responsive to Isense from the current sense circuit 130A. In some examples, during calibration intervals that use the driver circuit 102A, CS2 controls switches of the driver circuit 102A so that a voltage based on VDD is applied to the sense resistor RSNS. During calibration intervals that use the test circuit 118A, CS1 controls switches of the test circuit 118 so that a voltage based on VTEST is applied to the sense resistor RSNS. In some examples, the calibration controller 138A may provide additional control signals to the test circuit 118A and/or the driver circuit 102A to control calibration operations using the test circuit 118A and/or the driver circuit 102A.

The switch controller 144 operates to: receive Isense at its first terminal 146; receive CS_IN at its second terminal(s) 147; and provide PWM_IN at its third terminal 148 responsive to Isense and CS_IN. In some examples, CS_IN may include an audio input, a test-mode parameter to test the driver switch resistances, control signals from the calibration controller 138A to control the switch controller 144 during calibration intervals, and/or other control signals. In some examples, the switch controller 144 uses Isense to: estimate a resistivity and/or temperature of the speaker 112A; and adjust PWM_IN responsive to the estimated resistivity and/or temperature.

Figures 3A, 3B:
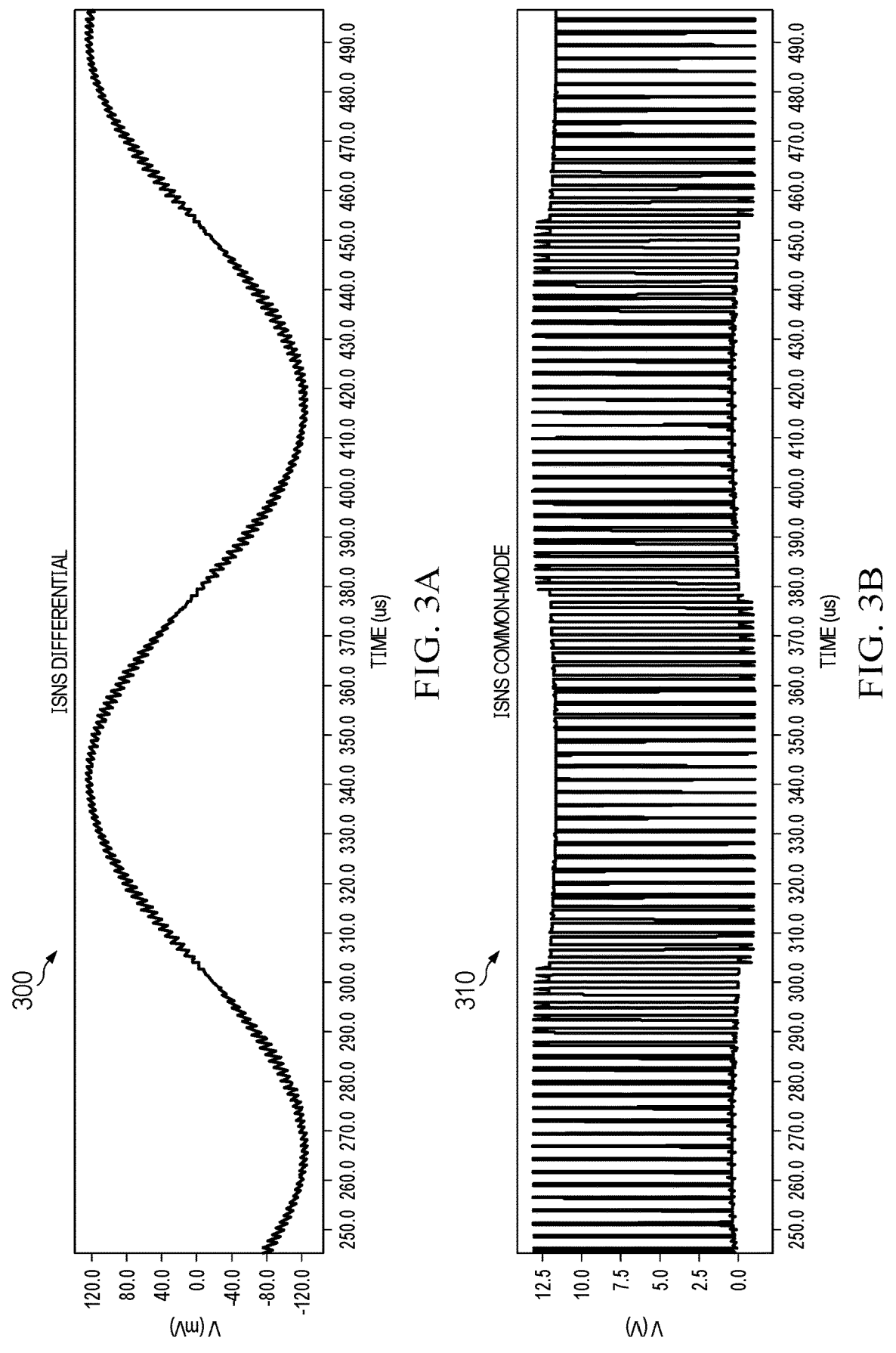
FIGS. 3A and 3B are graphs showing example sense signals.

FIGS. 3A and 3B are graphs 300 and 310 showing example sense signals. The graph 300 of FIG. 3A shows a current sense (ISNS) differential signal. The ISNS differential signal is the signal generated across the sense resistor RSNS. In some examples, the ISNS differential signal is in the range of +/−180 mVpp. The graph 310 of FIG. 3B shows an ISNS common-mode signal. The ISNS common-mode signal corresponds to VOUTP or VOUTN1 and is in the range of 0 to 13V. In the described examples, each current sense circuit (e.g., the current sense circuit 130 in FIG. 1, the current sense circuit 130A in FIG. 2, or the current sense circuit 130B in FIG. 4) operates to recover the ISNS differential signal and reject the ISNS common-mode signal. The accuracy of ISNS differential signal recovery and of ISNS common-mode signal rejection is indicated by the common-mode rejection ratio (CMRR) of the current sense circuit. To achieve a target current sense accuracy, a CMRR above 90 dB may be used. To maintain the target CMRR over time, current sense circuit calibration is performed.

In some examples, current sense circuit calibration involves: obtaining Isense measurements with and without a common-mode signal; and trimming resistors of the current sense circuit so that the effect of the common-mode signal on Isense measurements is as close to zero as possible. If current sense circuit calibration is only performed once and/or is performed before integrated circuit (IC) packaging and installation, the calibration may not achieve or maintain the target CMRR. In the described examples, current sense circuit calibration may be performed after IC packaging and installation, and/or may be performed periodically to achieve or maintain the target CMRR. In some examples, current sense circuit calibration obtains Isense measurements based on VDD and VTEST (e.g., SR1 and SR2 in FIGS. 1 and 2) during different calibration intervals, where VDD includes the common-mode signal and VTEST does not include the common-mode signal. The results are used to adjust trimmable resistors (e.g., the trimmable resistor(s) 136 in FIG. 1, the trimmable resistors TR1 and TR2 in FIG. 2, or the trimmable resistors TR3 and TR4 in FIG. 4) until the effect of the common-mode signal on Isense is below a threshold. To reduce inconvenience to customers and product unavailability, current sense circuit calibration operations may be entirely self-sufficient, without use of any external analog stimulus or monitoring. In a speaker scenario, the current sense circuit calibration operations may avoid introducing audible artifacts.

Figure 4:
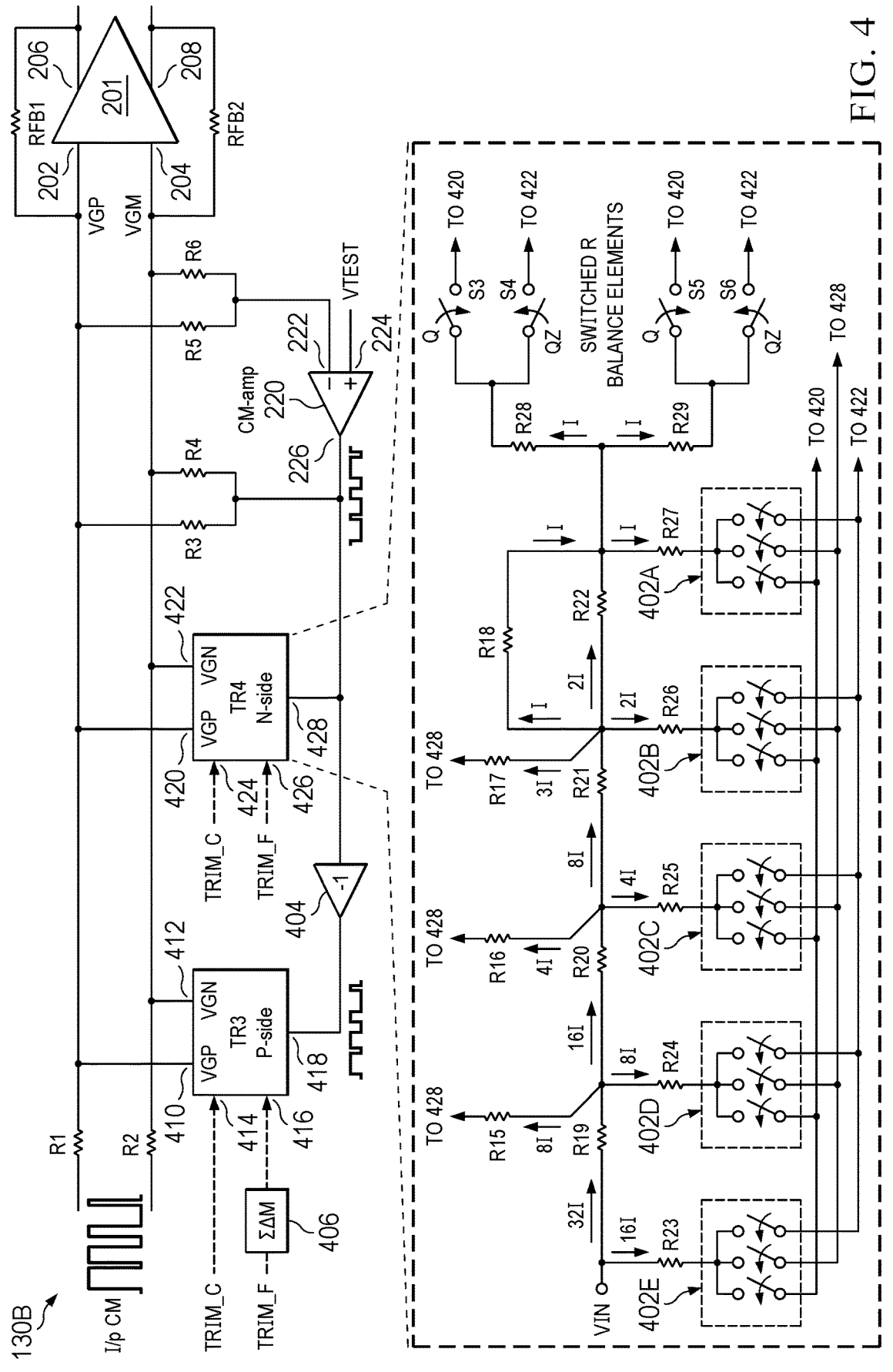
FIG. 4 is a diagram showing an example current sense circuit.

FIG. 4 is a diagram showing an example current sense circuit 130B. The current sense circuit 130B is an example of the current sense circuit 130 in FIG. 1, or the current sense circuit 130A in FIG. 2. In the example of FIG. 4, the current sense circuit 130B includes the operational amplifier 201, resistors R1 to R6, trimmable resistors TR3 and TR4, feedback resistors RFB1 and RFB2, and the input common-mode regulating amplifier 220. In the example of FIG. 4, the trimmable resistor TR3 is an example of the trimmable resistor(s) 136 in FIG. 1, or the trimmable resistor TR1 in FIG. 2. The trimmable resistor TR4 is an example of the trimmable resistor(s) 136 in FIG. 1, or the trimmable resistor TR2 in FIG. 2. Also, the resistors R3 and R4 in FIG. 4 mayor may not be included in the current sense circuit 130A of FIG. 2. The current sense circuit 130B also includes an inverting amplifier 404 and a sigma-delta (ΣΔ) modulator 406. The feedback resistor RFB1 is an example of R7 and/or R8 in FIG. 2. The feedback resistor RFB2 is an example of R9 and/or R10 in FIG. 2.

In the example of FIG. 4, the trimmable resistor TR3 has a first terminal 410, a second terminal 412, a third terminal 414, a fourth terminal 416, and a fifth terminal 418. The trimmable resistor TR4 has a first terminal 420, a second terminal 422, a third terminal 424, a fourth terminal 426, and a fifth terminal 428. In some examples, the topology of each of the trimmable resistors TR3 and TR4 is based on a 5-bit R2R ladder portion and a ΣΔ-switched balance R portion. An example topology of the trimmable resistor TR4 is provided in FIG. 4. The 5-bit R2R ladder portion of the trimmable resistor TR4 includes switch networks 402A to 402E and resistors R15 to R27 in the arrangement shown. The ΣΔ-switched balance R portion of the trimmable resistor TR4 includes switches S3 to S6 and resistors R28 and R29 in the arrangement shown. In some examples, each of the trimmable resistors TR3 and TR4 has a differential structure to maintain symmetry to cancel errors such as charge injection errors. In some examples, each of the trimmable resistors TR3 and TR4 are controlled, at least in part, by a control signal (e.g., CAL_CS in FIGS. 1 and 2, or TRIM_C and TRIM_F in FIG. 4) that is proportional to the input common-mode voltage.

In some examples, calibration of the current sense circuit 130B involves trimming mismatches in the input resistors (R1 and R2) and the common-mode resistors (R3 and R4) based on adjustments to the trimmable resistors TR3 and TR4. In some examples, the output of the input common-mode regulating amplifier 220 is a scaled-down and inverted version of ISNS common-mode, which is provided to the fifth terminal 428 of the trimmable resistor TR4 to control switches of the trimmable resistor TR4. In the example of FIG. 4, the output of the input common-mode regulating amplifier 220 is also provided to the input of the inverting amplifier 404. The output of the inverting amplifier 404 is provided to the fifth terminal 418 of the trimmable resistor TR3 to control switches of the trimmable resistor TR3. In some examples, each of the trimmable resistors TR3 and TR4 are programmable resistors with an 11-bit resolution. For more information regarding trimmable resistors, such as the trimmable resistor(s) 136 in FIG. 1, the trimmable resistors TR1 and TR2 in FIG. 2, or the trimmable resistors TR3 and TR4 in FIG. 4, reference may be had to U.S. Pat. No. 11,152,904, which is hereby incorporated by reference herein in its entirety.

In the example of FIG. 4, the voltages at the first and second terminals 202 and 204 of the operational amplifier 201 are based on VTEST (e.g., provided by the test circuit 118 in FIG. 1, or the test circuit 118A in FIG. 2). The resulting common-mode current through the input resistors (R1 and R2) and the common-mode resistors (R3 and R4) of the current sense circuit 130A is zero. Accordingly, there is no common-mode error in the current sense circuit 130A during calibration intervals based on VTEST (sometimes referred to as "first calibration intervals" herein). When VOUTP and VOUTN1 are pulled to the same voltage, there is zero current flowing through the sense resistor RSNS, and the differential input to current sense circuit 130A is zero. In such examples, the first calibration interval results in an output voltage for the operational amplifier 201 that is equal to an offset voltage (Vos) of the operational amplifier 201. In other words, the result of the first calibration interval is VOUT=Vos=SR1.

For calibration intervals based on VDD and related common-mode sensing (sometimes referred to herein as second calibration intervals), the fourth terminal 108 and the fifth terminal 110 of the driver circuit 102A are pulled to VDD through the high-side transistors N1 and N3, while the transistors N5 and N6 of the test circuit 118A are turned off. Since the fourth terminal 108 and the fifth terminal 110 of the driver circuit 102A are pulled to same voltage, there is zero current flowing through sense resistor RSNS. Accordingly, the differential input to the current sense circuit 130A is zero. With VDD applied to the fourth terminal 108 and the fifth terminal 110 of the driver circuit 102A, there is a VCM equal to VDD-VTEST applied across the input resistors R1 and R2. Due to mismatches in the input resistors (R1 and R2) and the common-mode resistors (R3 and R4) of the current sense circuit 130A, VCM during the second calibration interval results in some additional common-mode error (VCM_error) in VOUT of the operational amplifier 201. In other words, the result of the second calibration interval is VOUT=Vos+VCM_error=SR2.

The difference between SR2−SR1=VCM_error is determined by the calibration controller 138A. Based on VCM_error, the trimmable resistors (e.g., the trimmable resistor(s) 136 in FIG. 1, the trimmable resistors TR1 and TR2 in FIG. 2, or the trimmable resistors TR3 and TR4 in FIG. 4) of a current sense circuit are tuned until the VCM_error=0. For example, once a trim code that results in VCM_error=0 is found, this trim code is applied to the trimmable resistors. For example, the result of adjusting the trim code for the trimmable resistors TR3 and TR4 is that any VCM at the first terminal 131 and the second terminal 132 of the current sense circuit 130B will not lead to changes in the output voltage of the operational amplifier 201.

In some examples, VTEST=1.2V, while VDD may be 2.4V or more. During the trim routine, the feedback resistor value (R7, R8, R9, R10 in FIG. 2, or RFB1 and RFB2 in FIG. 4) may be doubled (e.g., by turning off the switches S1 and S2) to increase the gain of the operational amplifier 201. In this manner, the sensitivity of the operational amplifier 201 to VCM_error is increased during the trim routing.

In some examples, the trim range is of total 12-bits, but package stress shift is expected to only affect the final 6-bits. In such examples, a binary-search to determine the trim code is run on only the last 6-bits, and the first 6-bits are kept unchanged from a previously determined trim code. If package stress shift is greater than the 6 LSBs, a range correction may be performed if the output voltage of the operational amplifier 201 changes due to VCM_error by more than a threshold. In such examples, the trim range may be adjusted in either direction (e.g., by 2-bits in either direction). After the trim search is complete, a pass/fail check is conducted again checking for VCM_error. If the resulting VCM_error is less than a predetermined threshold, the trim search has passed. Otherwise, the trim search has failed. In some examples, the threshold used for pass/fail determination may be scaled based on VDD. In some examples, the pass/fail status is updated as a bit that can be monitored via a user interface. In some examples, the trim routine may take about 1 ms to complete.

Figure 5A:
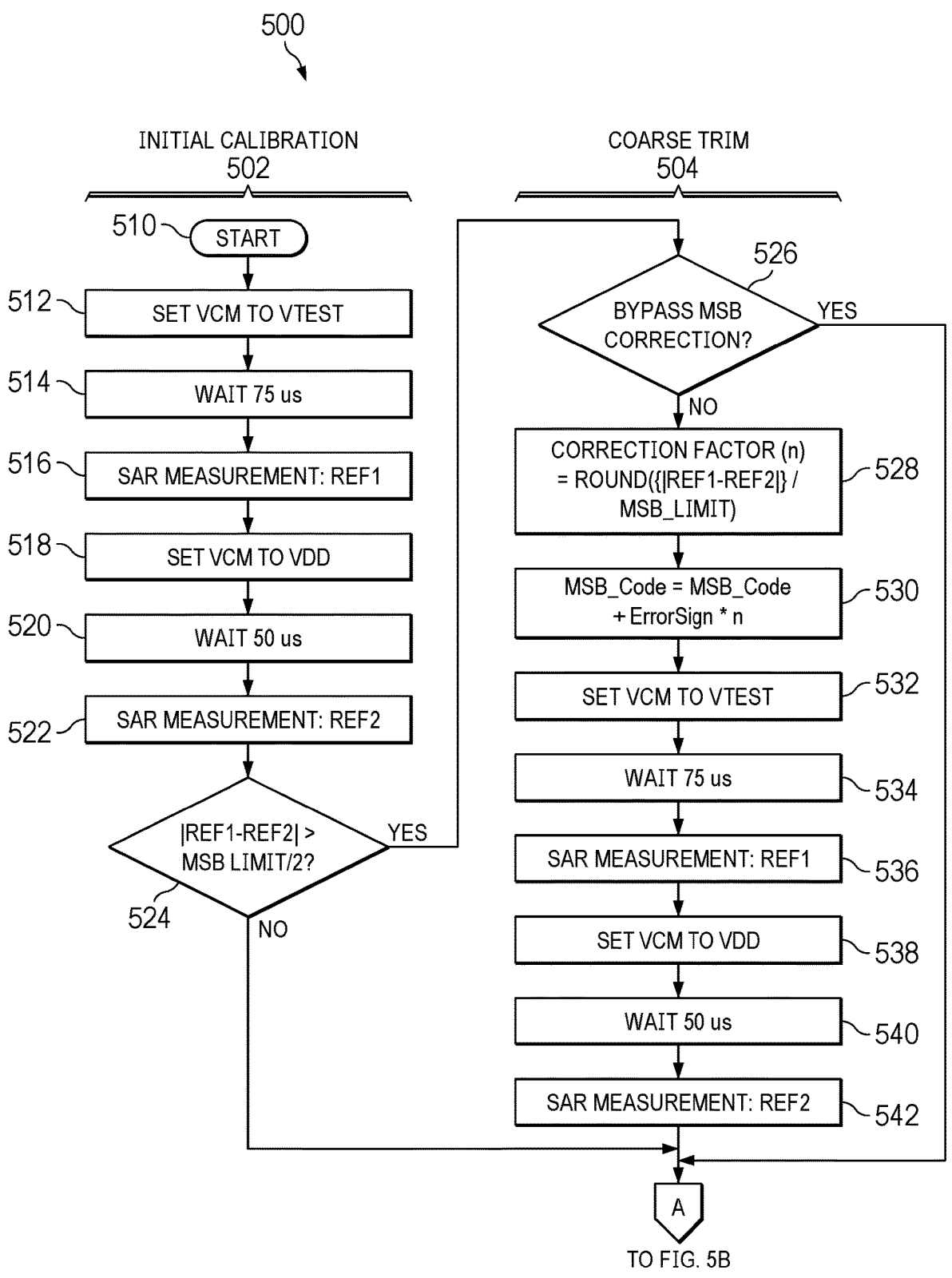
FIGS. 5A and 5B is a diagram showing an example current sense calibration method.
Figure 5B:
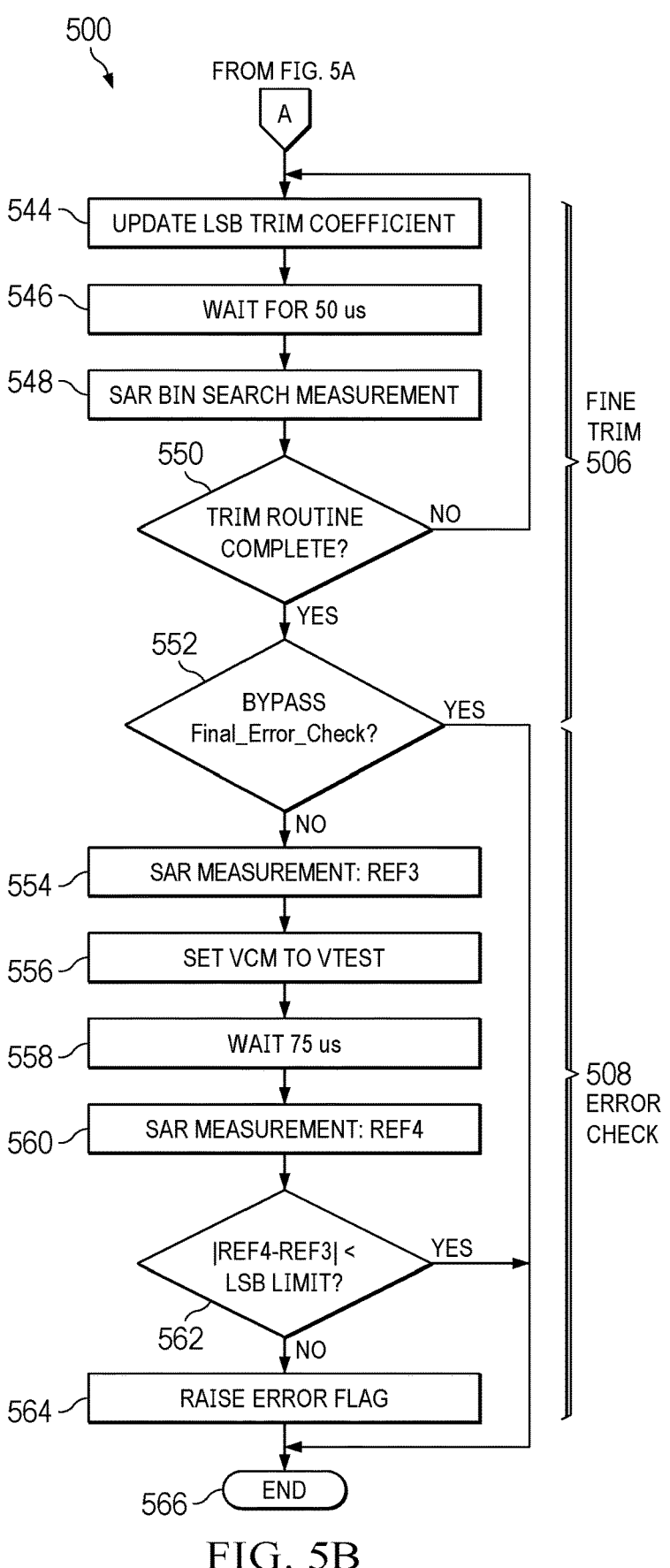

FIGS. 5A and 5B is a diagram showing example current sense calibration method 500. The current sense calibration method 500 includes an initial calibration portion 502, a coarse trim portion 504, a fine trim portion 506, and an error check portion 508. The initial calibration portion 502 includes a start block 510. At block 512, the common-mode voltage (VCM) is set to VTEST. At block 514, the method 500 waits for a first waiting interval (e.g., 75 us). At block 516, a successive approximate register (SAR) value (REF1) is determined responsive to VCM being set to VTEST. In some examples, the REF1 is determined by the ADC 210 responsive to VOUT from the operational amplifier 201. At block 518, VCM is set to VDD. At block 520, the method 500 waits for a second waiting interval (e.g., 50 us). At block 522, a second SAR value (REF2) is determined responsive to VCM being set to VDD. If REF1–REF2 is greater than a most significant bit (MSB)/2 (block 524), the method 500 proceeds to the coarse trim portion 504.

The coarse trim portion 504 of the method 500 includes a bypass MSB correction determination (block 526). If MSB correction is not bypassed (block 526), a correction factor (n) is set to round({|REF1–REF2|})/MSB_LIMIT at block 528, where "round" refers to the floor function of REF1 minus REF2 (i.e., the largest integer lower than the value calculated), and MSB_LIMIT is a threshold based on VDD. At block 530, an MSB_CODE is set to MSB_CODE+ ErrorSign*n, where ErrorSign is the direction of coarse correction, and n is a coarse correction code. At block 532, VCM is set to VTEST. At block 534, the method 500 waits for the first waiting interval. At block 536, a first SAR value (REF1) is determined responsive to VTEST being set to VCM. At block 538, VCM is set to VDD. At block 540, the method 500 waits for the second waiting interval. At block 542, a second SAR value (REF2) is determined responsive to VCM being set to VDD.

The fine trim portion 506 includes updating a least-significant bit (LSB) trim coefficient at block 544. At block 546, the method 500 waits the second waiting interval. At block 548, a SAR binary search measurement is performed. If the fine trim routine is not complete (block 550), the method 500 returns to block 544. If the fine trim routine is complete (block 550), the method 500 proceeds to the error check portion 508.

In some examples, the error check portion 508 includes a bypass final error check option (block 552). If the final error check is bypassed (block 552), the method 500 ends. If the final error check is not bypassed (block 552), a third SAR value (REF3) is determined at block 554. At block 556, VCM is set to VTEST. At block 558, the method 500 waits for the first waiting interval. At block 560, a fourth SAR value (REF4) is determined responsive to VCM being set to VTEST. If REF4–REF3 is less than an LSB limit (block 562), the method 500 ends at block 566. If REF4–REF3 is not less than the LSB limit (block 562), an error flag is raised at block 564 and the method ends at block 566.

Figure 6:
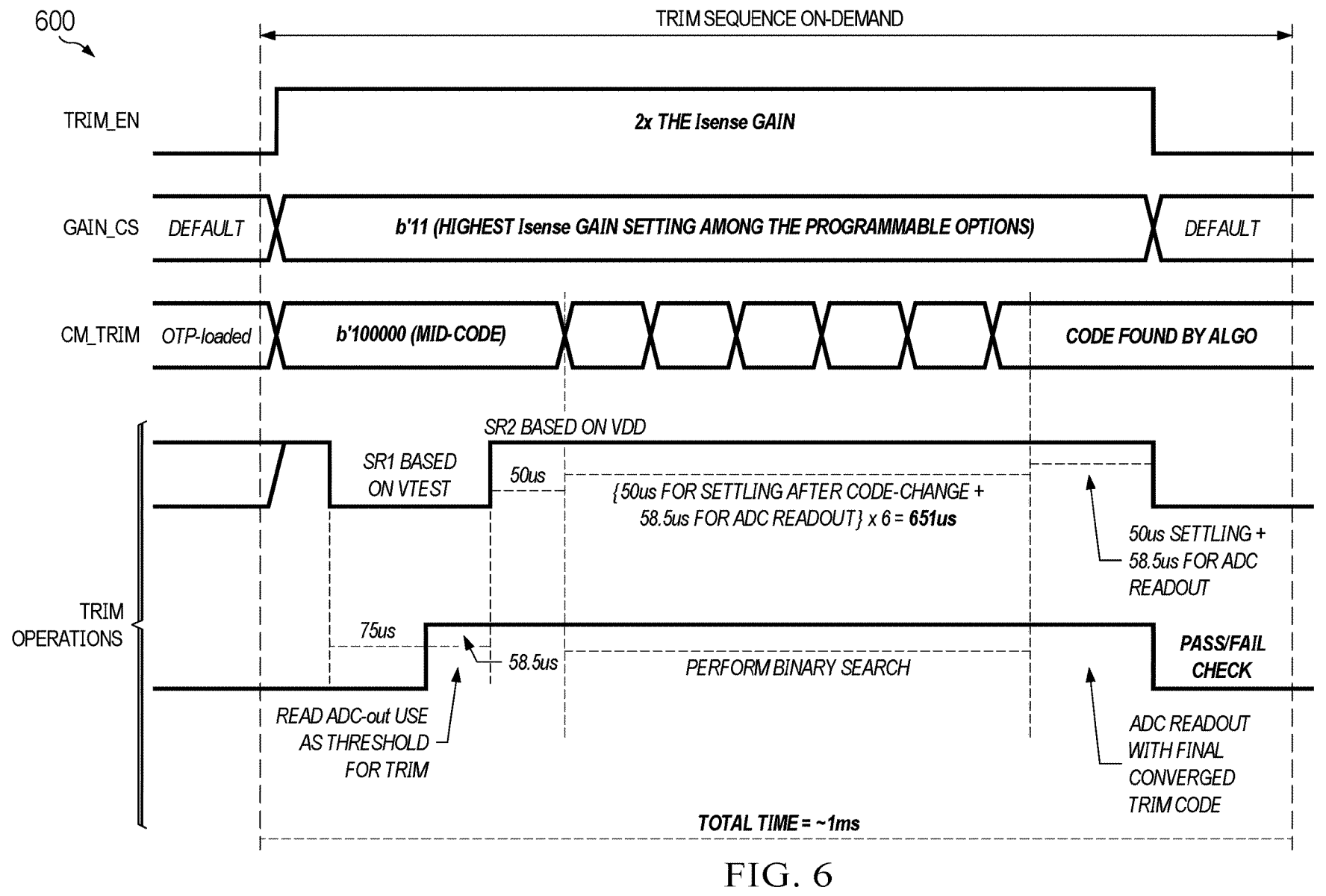

FIG. 6 is a timing diagram 600 showing example current sense calibration operations. The timing diagram 600 includes a trim enable signal (TRIM_EN), a current sense gain control signal (GAIN_CS), a common-mode trim control signal (CM_TRIM), and trim operations. When TRIM_EN is asserted, the gain setting for a current sense circuit, such as the current sense circuit 130A in FIG. 2 or the current sense circuit 130B in FIG. 4, is set to a maximum level responsive to GAIN_CS. For example, GAIN_CS may be used to turn off the switches S1 and S2 in FIG. 2 during the trim or calibration process.

The calibration process may start with an initial trim code for trimmable resistors (e.g., the trimmable resistor(s) 136 in FIG. 1, the trimmable resistors TR1 and TR2 in FIG. 2, or the trimmable resistors TR3 and TR4 in FIG. 4) of the current sense circuit. In some examples, the initial trim code may be based on an OTP code obtained before stress induced error due to soldering a related chip to a printed circuit board (PCB). In some examples, the calibration process involves searching for a trim code adjustment of up to the lower half of the bits of the initial trim code. In some examples, the calibration process includes a first calibration interval during which SR2 is obtained based on application of VTEST to the fourth and fifth terminals 108 and 110 of the driver circuit 102A, while VDD is not applied. In some examples, the calibration process includes a first calibration interval during which SR1 is obtained based on application of VTEST to the sense resistor RSNS, while VDD is not applied to the sense resistors RSNS. After the first waiting interval, the calibration process includes a second calibration interval during which SR2 is obtained based on application of VDD to the sense resistor RSNS, while VTEST is not applied to the sense resistor RSNS.

After the second waiting interval, SR1 and SR2 are used to determine VCM_error, and CM_TRIM is adjusted until VCM_error is negligible. After CM_TRIM is adjusted and after a settling interval for ADC readout, the calibration operations include performing the second calibration interval again to obtain SR2 based on the updated trim code and application of VDD to the sense resistor RSNS. If SR2 indicates VCM_error has been reduced to below a threshold, the calibration process is complete. Otherwise, further calibration operations may be used to adjust and test trim codes until SR2 for a given trim code indicates VCM_error is below the threshold when VDD is applied to the sense resistor RSNS.

Figure 7:
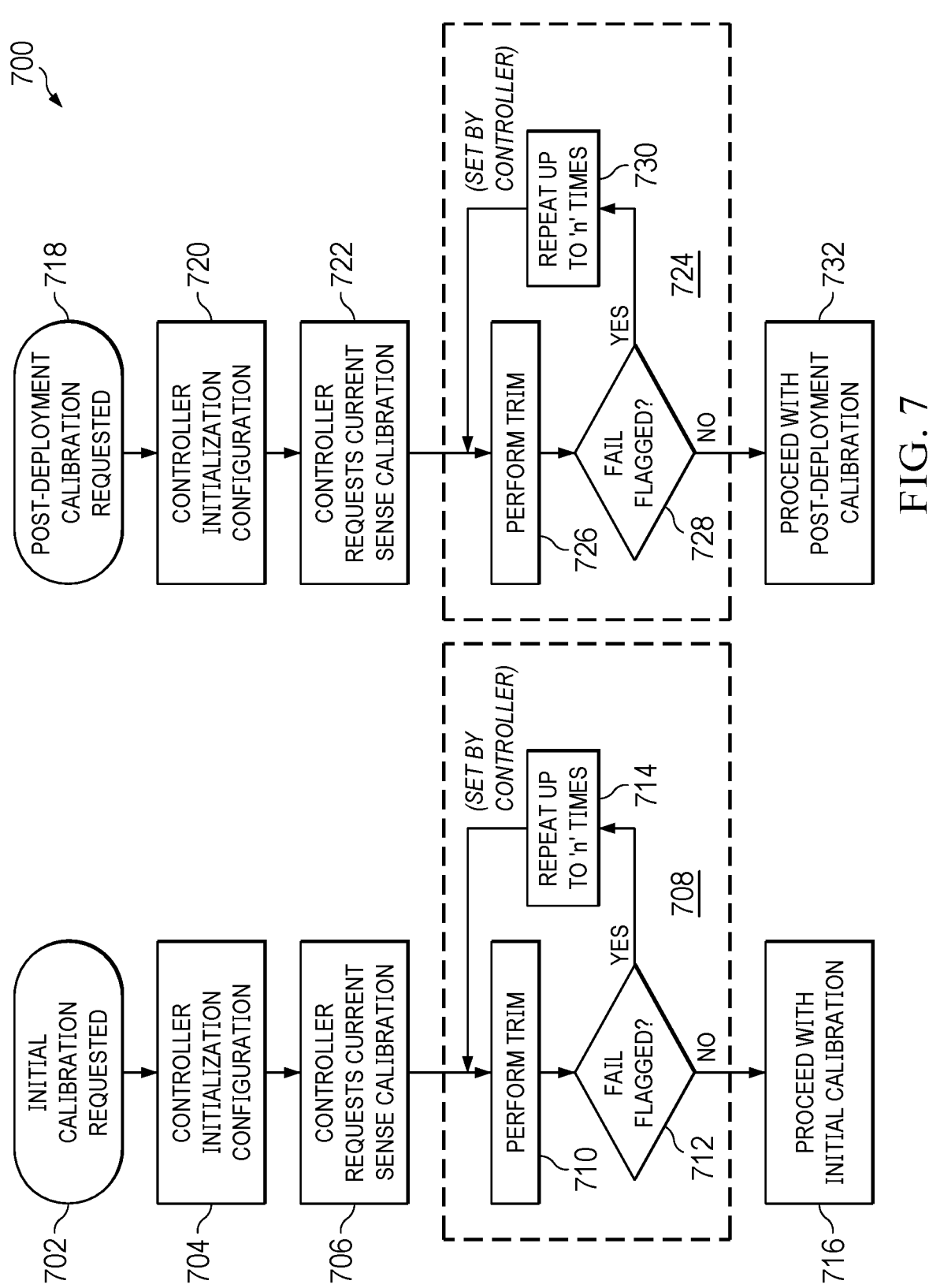
FIG. 7 is a flowchart showing another example current sense calibration method.

FIG. 7 is a flowchart showing another example current sense calibration method 700. As shown, the method 700 includes an initial calibration being requested at block 702. The initial calibration may be performed, for example, before an IC device is mounted to a customer printed circuit board (PCB), and before related die stress ensues. At block 704, controller initialization and configuration is performed at block 704. In some examples, the controller initialization and configuration of block 704 involves operations of the calibration controller 138 of FIG. 1, or the calibration controller 138A of FIG. 2. At block 706, the controller requests current sense calibration (block 708). In the example of FIG. 7, the current sense calibration of block 708 includes performing trim operations at block 710. In some examples, the trim operations of block 710 include adjusting the trim code for trimmable resistors of a current sense circuit to account for VCM_error as described herein. If a trim fail is flagged (block 712), the trim operations of block 710 are repeated, where block 714 may limit the number of repetitions. If a trim fail is not flagged (block 712), the method 700 proceeds with the initial calibration operations at block 716, including re-calibration of a current sense circuit based on an updated trim code determined by the current sense calibration of block 708.

After deployment, an IC device may benefit from recalibration due to die-stress issues. Example deployment of the IC device may include soldering the IC device to a customer PCB. At block 718, post-deployment calibration is requested. In some examples, post-deployment calibration is requested in response to each power-up cycle, a hardware reset, a schedule, and/or a calibration trigger. In response, controller initialization and configuration of the related circuit are performed at block 720. At block 722, the controller requests current sense calibration at block 724. In the example of FIG. 7, the current sense calibration of block 724 includes performing trim operations at block 726. In some examples, the trim operations of block 726 include adjusting the trim code for trimmable resistors of a current sense circuit to account for VCM_error as described herein. If a trim fail is flagged (block 728), the trim operations of block 726 are repeated, where block 730 may limit the number of repetitions. If a trim fail is not flagged (block 728), the method 700 proceeds with post-deployment calibration operations at block 732, including re-calibration of a current sense circuit based on an updated trim code determined by the current sense calibration of block 724.

Figure 8:
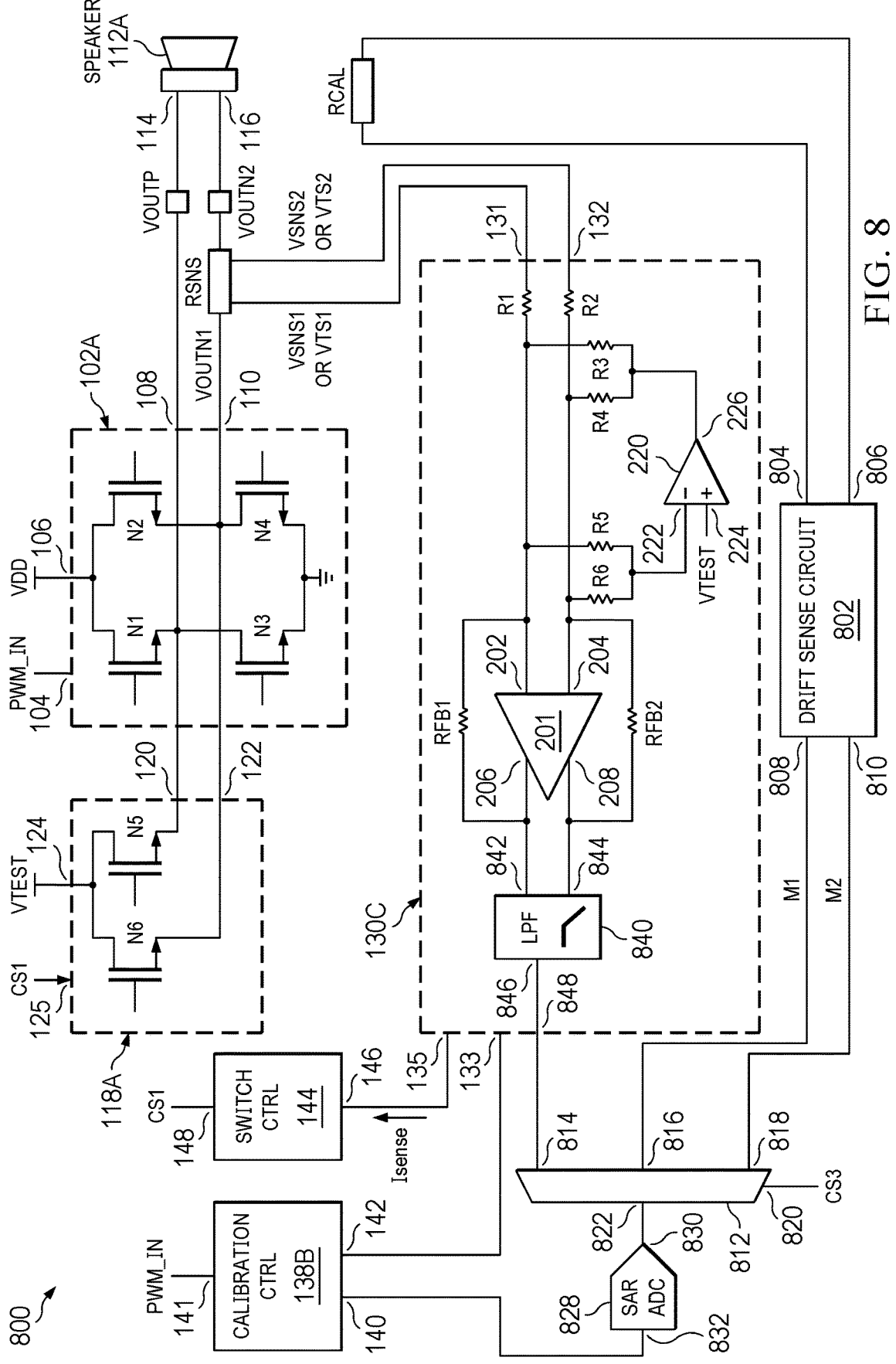
FIG. 8 is a diagram showing yet another example system.

FIG. 8 is a diagram showing yet another example system 800. In the example of FIG. 8, the system 800 includes the driver circuit 102A, the speaker 112A, the test circuit 118A, a current sense circuit 130C, a multiplexer 812, a SAR ADC 828, a calibration controller 138B, and the switch controller 144. The system 800 also includes a calibration resistor RCAL and a drift sense circuit 802.

As shown, the driver circuit 102A, the test circuit 118A, the calibration controller 138B, and the switch controller 144 have the same terminals described in FIG. 1 for the respective circuits. The current sense circuit 130C has the first terminal 131, the second terminal 132, the third terminal 133, a fourth terminal 848, a fifth terminal 135. The fourth terminal 848 in FIG. 8 replaces the fourth terminal 134 in FIGS. 1 and 2. The calibration resistor RCAL has a first terminal and a second terminal. The drift sense circuit 802 has a first terminal 804, a second terminal 806, a third terminal 808, and a fourth terminal 810. The multiplexer 812 has a first terminal 814, a second terminal 816, a third terminal 818, a fourth terminal 820, and a fifth terminal 822. The SAR ADC 828 has a first terminal 830 and a second terminal 832.

In the example of FIG. 8, the current sense circuit 130C has the same topology as the current sense circuit 130A in FIG. 2, except: the resistors R7, R8 and the switch SW1 are replaced by the feedback resistor RFB1; the resistors R9, R10 and the switch SW2 are replaced by the feedback resistor RFB2; the ADC 210 is replaced by the SAR ADC 828, which is shown as external to the current sense circuit 130C; and a lowpass filter (LPF) 840 is shown for the current sense circuit 130C. An LPF such as the LPF 840 may also be included with the current sense circuit 130 of FIG. 1, the current sense circuit 130A of FIG. 2, the current sense circuit 130B of FIG. 3. In the example of FIG. 8, the LPF 840 has a first terminal 842, a second terminal 844, and a third terminal 846.

The first terminal 842 of the LPF 840 is coupled to the third terminal 206 of the operational amplifier 201. The second terminal 844 of the LPF 840 is coupled to the fourth terminal 208 of the operational amplifier 201. The third terminal 846 of the LPF 840 is coupled to the fourth terminal 848 of the current sense circuit 130C.

The first terminal of the calibration resistor RCAL is coupled to the first terminal 804 of the drift sense circuit 802. The second terminal of the calibration resistor RCAL is coupled to the second terminal 806 of the drift sense circuit 802. The first terminal 814 of the multiplexer 812 is coupled to fourth terminal 848 of the current sense circuit 130C. The second terminal 816 of the multiplexer 812 is coupled to the third terminal 808 of the drift sense circuit 802. The third terminal 818 of the multiplexer 812 is coupled to the fourth terminal 810 of the drift sense circuit 802. The fourth terminal 820 of the multiplexer is coupled to a control signal (CS2) source (not shown). The fifth terminal 822 of the multiplexer 812 is coupled to the first terminal 830 of the SAR ADC 828. The second terminal 832 of the SAR ADC 828 is coupled to the first terminal 140 of the calibration controller 138B.

In some examples, the drift sense circuit 802 operates to: obtain calibration resistor sense results responsive to applying a voltage to the calibration resistor RCAL; and provide the calibration resistor sense results to the calibration controller 138B via the multiplexer 812 and the SAR ADC 828.

In some examples, the drift sense circuit 802 includes a ratiometric circuit having a first sense path and a second sense path, where the calibration resistor RCAL is part of the first sense path. In such examples, the drift sense circuit 802 operates to obtain calibration resistor sense results responsive to applying a voltage to the first sense path and the second sense path. In the example of FIG. 8, the calibration resistor sense results include M1 and M2, where M1 is provided at the third terminal 808 of the drift sense circuit 802 and M2 is provided at the fourth terminal 810 of the drift sense circuit 802.

In the example of FIGS. 8, M1 and M2 are provided to the calibration controller 138B via the multiplexer 812 and the SAR ADC 828. The calibration controller 138B operates to: perform trim operations responsive to SR1 and SR2 as described previously. In some examples, the resistor value drift results obtained for the calibration resistor RCAL are applied to the sense resistor RSNS and/or are applied to the calibration of the current sense circuit 130C.

Figure 9:
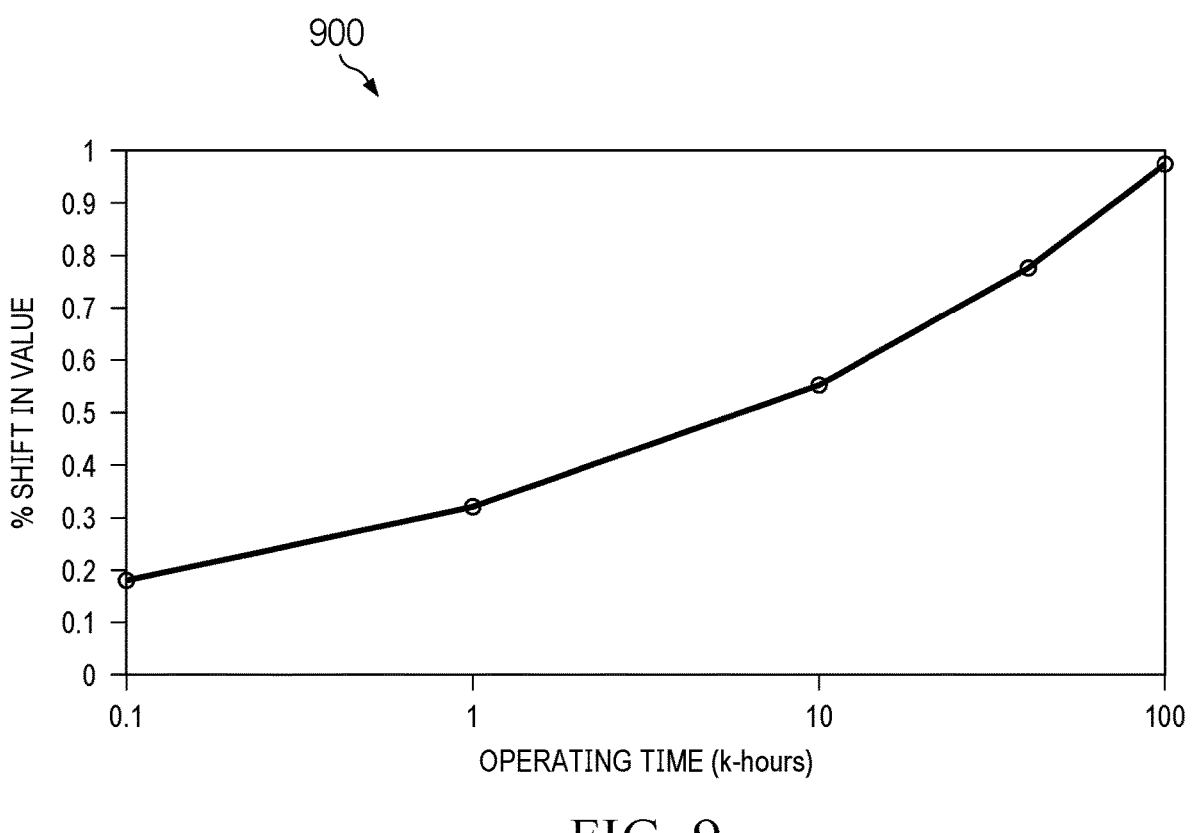
FIG. 9 is a graph showing example resistor value drift as a function of time.

FIG. 9 is a graph 900 showing example resistor value drift as a function of time. As shown in graph 900, an initial percentage of resistor value drift is about 0.2%. As the operating time increases, the percentage of resistor value drift increases to about 1.0%. In some examples, the graph 900 relates to resistor value drift for polysilicon high-sheet resistance (HSR) resistors. Other resistor types may suffer from more or less resistor value drift. In some examples, the calibration resistor RCAL and the sense resistor RSNS are the same type of resistor. In some examples, the calibration resistor RCAL and the sense resistor RSNS have the same resistor value. In some examples, the calibration resistor RCAL and the sense resistor RSNS are located within a target distance of each other on a circuit so that they have a similar aging environment.

Figure 10A:
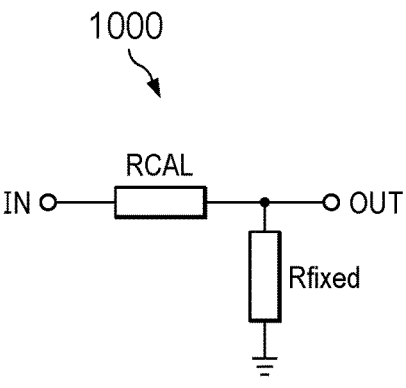
FIGS. 10a, 10b, and 11 are schematic diagrams showing example calibration resistor arrangements.
Figure 10B:
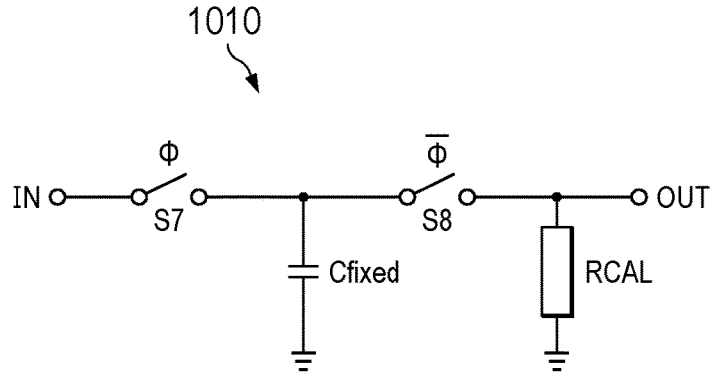
Figure 11:
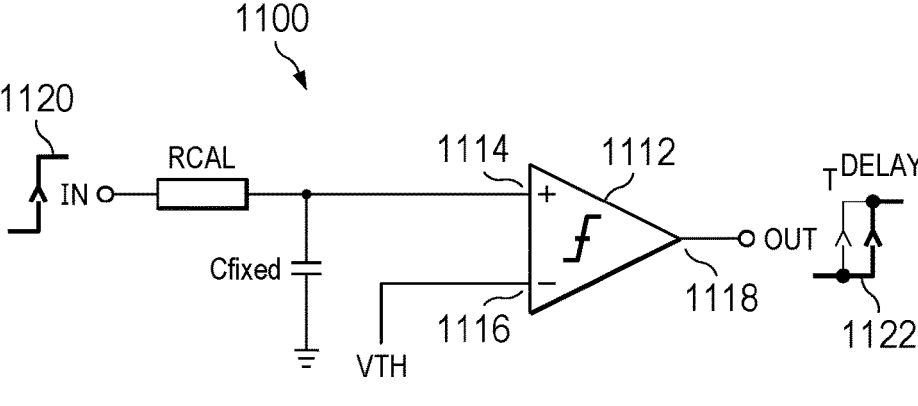

FIGS. 10a, 10b, and 11 are schematic diagrams showing example calibration resistor arrangements 1000, 1010, and 1100. In the calibration resistor arrangement 1000 of FIG. 10a, the calibration resistor RCAL is part of a voltage divider with a fixed value resistor Rfixed. In some examples, the fixed value resistor Rfixed is a metal resistor. Each of the calibration resistor RCAL and the fixed value resistor Rfixed has a first terminal and a second terminal. In the example of the FIG. 10a, the first terminal of the calibration resistor RCAL is coupled to an input (IN) terminal. The second terminal of the calibration resistor RCAL is coupled to the first terminal of the fixed value resistor Rfixed and to an output (OUT) terminal. The second terminal of the fixed value resistor Rfixed is coupled to a ground terminal or ground.

When an input calibration voltage (VIN_CAL) is applied at the IN terminal, the voltage divider formed by the calibration resistor RCAL and the fixed value resistor Rfixed provides an output calibration voltage (VOUT_CAL) proportional to VIN_CAN and the values of the calibration resistor RCAL and the fixed value resistor Rfixed. For example, if the value of the calibration resistor RCAL and the fixed value resistor Rfixed are the same, VOUT_CAL is approximately half of VIN_CAL. Because drift in the value of the fixed value resistor Rfixed is negligible over time, any change in VOUT_CAL responsive to VIN_CAL may be assumed to be due to drift in the value of the calibration resistor RCAL.

In the calibration resistor arrangement 1010 of FIG. 10b, the calibration resistor RCAL is part of a voltage divider with a switched capacitor that uses a fixed value capacitor Cfixed. In some examples, the fixed value capacitor Cfixed is a metal capacitor. More specifically, the switched capacitor includes a switch S7, a switch S8, and the fixed value capacitor Cfixed. Each of the switches S7 and S8 has a respective first terminal, a respective second terminal, and a respective third terminal. As shown, the first terminal of the switch S7 is coupled is coupled to the IN terminal. The second terminal of the switch S7 is coupled to the first terminal of the fixed value capacitor Cfixed and to the first terminal of the switch S8. The second terminal of the fixed value capacitor Cfixed is coupled to a ground terminal or ground. The second terminal of the switch S8 is coupled to the first terminal of the calibration resistor RCAL and to the OUT terminal. The second terminal of the calibration resistor RCAL is coupled to a ground terminal or ground. The control terminal of the switch S7 is coupled to a first clock signal Φ source. The control terminal of the switch S8 is coupled to a second clock signal $\overline{\Phi}$ source, where the second clock signal $\overline{\Phi}$ is the inverse of the first clock signal Φ. In FIG. 10b, the switched capacitor behaves like a variable resistor on average, where the value of the variable resistor is a function of the fixed value capacitor Cfixed and the clock rates for Φ and $\overline{\Phi}$.

When VIN_CAL is applied at the IN terminal, the voltage divider formed by the switched capacitor and calibration resistor RCAL provides an output calibration voltage VOUT_CAL proportional to VIN_CAN and the resistive values of the switched capacitor and the calibration resistor RCAL. For example, if the resistive value of the switched capacitor and the calibration resistor RCAL are the same, VOUT_CAL is approximately half of VIN_CAL. Because drift in the value of the resistive value of the switched capacitor is negligible over time, any change in VOUT_CAL responsive to VIN_CAL may be assumed to be due to drift in the value of the calibration resistor RCAL.

In the calibration resistor arrangement 1100 of FIG. 11, the calibration resistor RCAL is part of a resistor-capacitor (RC) circuit with the fixed value capacitor Cfixed. In some examples, the fixed value capacitor Cfixed is a metal capacitor. The fixed value capacitor Cfixed has a first terminal and a second terminal. The calibration resistor arrangement 1100 also includes a comparator 1112 having a first terminal 1114, a second terminal 1116, and a third terminal 1118. As shown, the first terminal of the calibration resistor RCAL is coupled to the IN terminal. The second terminal of the calibration resistor RCAL is coupled to the first terminal of the fixed value capacitor Cfixed and to a first terminal 114 of the comparator 1112. The second terminal of the fixed value capacitor Cfixed is coupled to a ground terminal or ground. The second terminal 1116 of the comparator 1112 is coupled to a threshold voltage (VTH) source (not shown). The third terminal 1118 of the comparator 1112 is coupled to the OUT terminal.

When an input pulse 1120 is applied at the IN terminal, the RC circuit formed by the calibration resistor RCAL and the fixed value capacitor Cfixed provides a rising voltage at the first terminal 1114 of the comparator 1112. The rise time of the rising voltage at the first terminal 1114 of the comparator 1112 is a function of the values of the calibration resistor RCAL and the fixed value capacitor Cfixed. When the rising voltage at the first terminal 1114 of the comparator reaches the value of VTH at the second terminal 1116 of the comparator, a compare result signal 1122 is asserted at the third terminal 1118 of the comparator. The delay between the input pulse 1120 and the compare result signal 1122 is proportional to the value the calibration resistor RCAL. Because drift in the value of the fixed value capacitor Cfixed is negligible over time, any change in the delay between the input pulse 1120 and the compare result signal 1122 may be assumed to be due to drift in the value of the calibration resistor RCAL.

Figure 12:
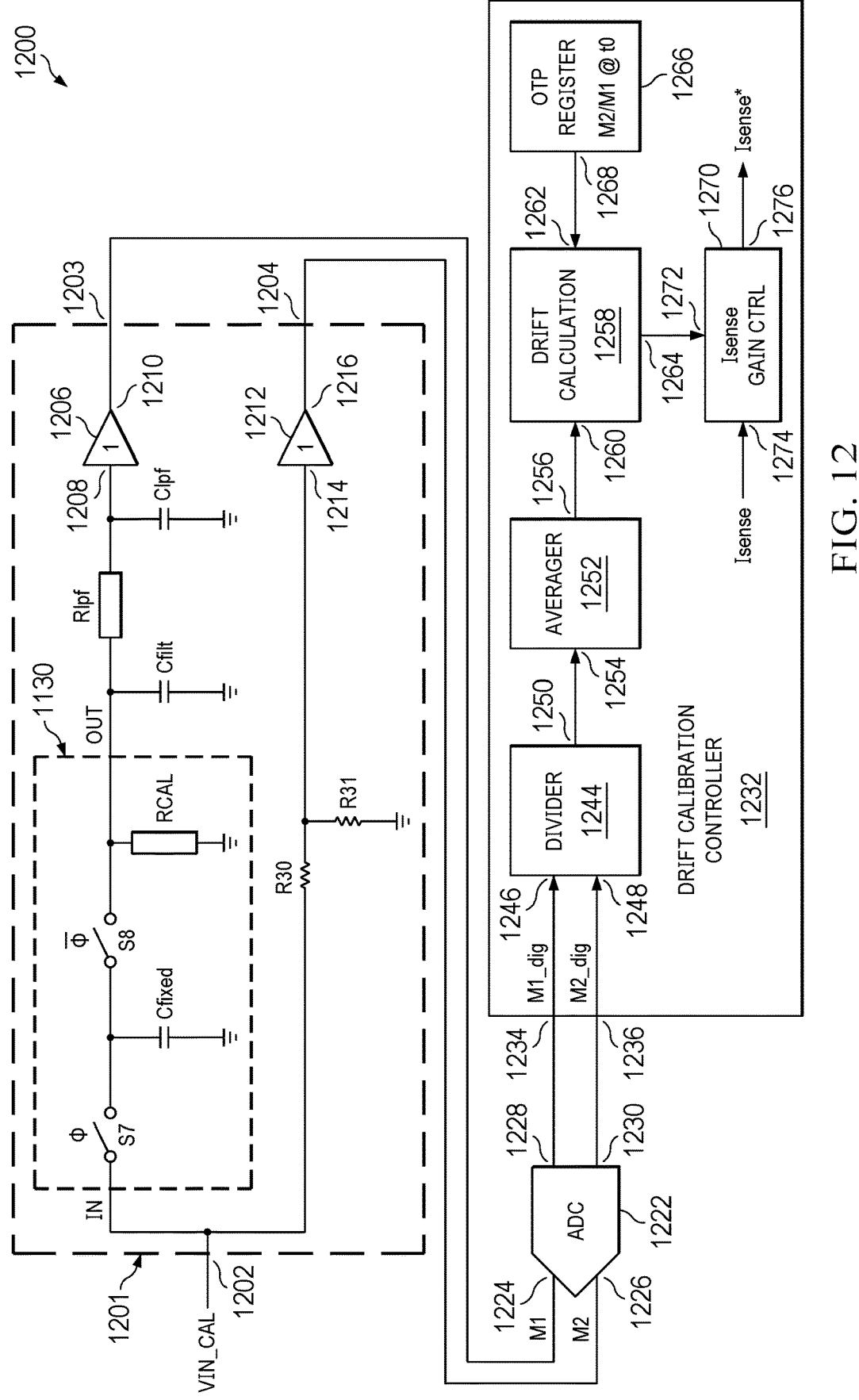
FIG. 12 is a diagram showing example drift calibration circuitry.

FIG. 12 is a diagram showing example drift calibration circuitry 1200. In the example of FIG. 12, the drift calibration circuitry 1200 includes a ratiometric measurement circuit 1201, an ADC 1222, and a drift calibration controller 1232. In some examples, the ratiometric measurement circuit 1201 and the ADC 1222 are components of the drift sense circuit 802 of FIG. 8. The drift calibration controller 1232 may be part of the calibration controller 138 in FIG. 1, the calibration controller 138A in FIG. 2, or the calibration controller 138B in FIG. 3.

As shown, the ratiometric measurement circuit 1201 has a first terminal 1202, a second terminal 1203, and a third terminal 1204. In some examples, the ratiometric measurement circuit 1201 includes the calibration resistor arrangement 1130, a first capacitor Cfilt, a resistor Rlpf, a capacitor Clpf, resistors R30 and R31, a first buffer circuit 1206, and a second buffer circuit 1212. The calibration resistor arrangement 1130, the first capacitor Cfilt, the resistor Rlpf, the capacitor Clpf, and the first buffer circuit 1206 form a first sense path of the ratiometric measurement circuit 1201. The resistors R30 and R31, and the second buffer circuit 1212 form a second sense path of the ratiometric measurement circuit 1201. The calibration resistor arrangement 1130 includes the switched capacitor and the calibration resistor RCAL described in FIG. 11c. Again, the switched capacitor is based on the first switch S7, the second switch S8, the fixed value capacitor Cfixed. The first buffer circuit 1206 has a first terminal 1208 and a second terminal 1210. The second buffer circuit 1212 has a first terminal 1214 and a second terminal 1216. The ADC 1222 has a first terminal 1224, a second terminal 1226, a third terminal 1228, and a fourth terminal 1230. The drift calibration controller 1232 has a first terminal 1234 and a second terminal 1236.

In the example of FIG. 12, the drift calibration controller 1232 includes a divider 1244, an averager 1252, a drift calculator 1258, an OTP register 1266, and an Isense gain controller 1270. The divider 1244 has a first terminal 1246, a second terminal 1248, and a third terminal 1250. The averager 1252 has a first terminal 1254 and a second terminal 1256. The drift calculator 1258 has a first terminal 1260, a second terminal 1262, and a third terminal 1264. The OTP register 1266 has a terminal 1268. The Isense gain controller 1270 has a first terminal 1272, a second terminal 1274, and a third terminal 1276.

In the example of FIG. 12, the first terminal 1202 of the ratiometric measurement circuit 1201 is coupled to the IN terminal of the calibration resistor arrangement 1130. The OUT terminal of the calibration resistor arrangement 1130 is coupled to the first terminal of the capacitor Cfilt and to the first terminal of the resistor Rlpf. The second terminal of the capacitor Cfilt is coupled to a ground terminal or ground. The second terminal of the resistor Rlpf is coupled to the first terminal of the capacitor Clpf and to the first terminal 1208 of the first buffer circuit 1206. The second terminal of the capacitor Clpf is coupled to a ground terminal or ground.

The second terminal 1210 of the first buffer circuit 1206 is coupled to the second terminal 1203 of the ratiometric measurement circuit 1201.

The first terminal 1202 of the ratiometric measurement circuit 1201 is also coupled to the first terminal of the resistor R30. The second terminal of the resistor R30 is coupled to the first terminal of the resistor R31 and to the first terminal 1214 of the second buffer circuit 1212. The second terminal of the resistor R31 is coupled to a ground terminal or ground. The second terminal 1216 of the second buffer circuit 1212 is coupled to the third terminal 1204 of the ratiometric measurement circuit 1201.

In the example of FIG. 12, the second terminal 1203 of the ratiometric measurement circuit 1201 is coupled to the first terminal 1224 of the ADC 1222. The third terminal 1204 of the ratiometric measurement circuit 1201 is coupled to the second terminal 1226 of the ADC 1222. The third terminal 1228 of the ADC 1222 is coupled to the first terminal 1234 of the drift calibration controller 1232. The fourth terminal 1230 of the ADC 1222 is coupled to the second terminal 1236 of the drift calibration controller 1232.

The first terminal 1246 of the divider 1244 is coupled to the first terminal 1234 of the drift calibration controller 1232. The second terminal 1248 of the divider 1244 is coupled to the second terminal 1236 of the drift calibration controller 1232. The third terminal 1250 of the divider 1244 is coupled to the first terminal 1254 of the averager 1252. The second terminal 1256 of the averager 1252 is coupled to the first terminal 1260 of the drift calculator 1258. The second terminal 1262 of the drift calculator 1258 is coupled to the terminal 1268 of the OTP register 1266. The third terminal 1264 of the drift calculator 1258 is coupled to the first terminal 1272 of the Isense gain controller 1270. The second terminal 1274 of the Isense gain controller 1270 receives Isense. The third terminal 1276 of the Isense gain controller 1270 provides an updated Isense signal (Isense*). In some examples, the drift calibration controller 1232 includes an additional terminal to receive Isense from another circuit such as a current sense circuit. In some examples, the drift calibration controller 1232 includes an additional terminal to provide Isense* to other circuitry.

In some examples, the ratiometric measurement circuit 1201 operates to: receive VIN_CAL at its first terminal 1202; provide first sense result M1 at its second terminal 1203 responsive to the operations of the calibration resistor arrangement 1130, the capacitor Cfilt, the resistor Rlpf, the capacitor Clpf, and the first buffer circuit 1206; and provide second sense result M2 at its third terminal 1204 responsive to the resistors R30 and R31, and the operations of the second buffer circuit 1212. In some examples, the values for the capacitor Cfilt, the resistor Rlpf, and the capacitor Clpf are selected to eliminate high-frequency switching noise introduced by the switch S7 and/or the switch S8. The first buffer circuit 1206 operates to adjust the voltage level and/or current level of M1. The second buffer circuit 1212 operates to adjust the voltage level and/or current level of M2.

The ADC 1222 operates to: receive M1 at its first terminal 1224; receive M2 at its second terminal 1226; provide a digitized version of M1 (M1_dig) at its third terminal 1228 responsive to M1; and provide a digitized version of M2 (M2_dig) at its fourth terminal 1230 responsive to M2.

The drift calibration controller 1232 operates to: receive M1_dig at its first terminal 1234; receive M2_dig at its second terminal 1236; receive Isense; and provide Isense* responsive to M1_dig, M2_dig, and Isense. In some examples, the divider 1244 of the drift calibration controller 1232 operates to: receive M1_dig at its first terminal 1246;

receive M2_dig at its second terminal 1248; and provide a division result (e.g., M2_dig/M1_dig) responsive to M1_dig and M2_dig. In some examples, the averager 1252 operates to: receive N samples of the division result from the divider 1244; and provide an averaged division result based on the N samples of the division result. The OTP register 1266 operates to: store an initial division result based on an initial calibration; and provide the initial division result upon request to the drift calculator 1258.

The drift calculator 1258 operates to: receive the averaged division result (i.e., the average M2/M1 over multiple samples) at its first terminal 1260; receive the initial division results at its second terminal 1262; and provide drift results at its third terminal 1264 responsive to the difference between the averaged division result and the initial division results.

The Isense gain controller 1270 operates to: receive the drift results at its first terminal 1272; receive Isense at its second terminal 1274; and provide Isense* at its third terminal 1276 responsive to the drift results and Isense. In some examples, the drift calibration controller 1232 uses individual circuits to perform the operations of the divider 1244, the average 1252, the drift calculator 1258, the OTP register 1266; and the Isense gain controller 1270. In other examples, the drift calibration controller 1232 uses a processor and a memory with instructions to perform the operations of the divider 1244, the average 1252, the drift calculator 1258, the OTP register 1266; and the Isense gain controller 1270.

Figure 13:
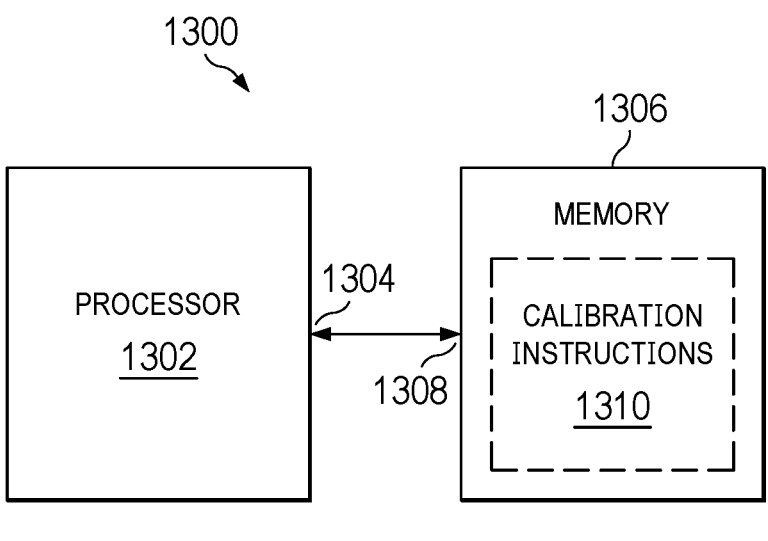
FIG. 13 is a diagram showing other example calibration circuitry.

FIG. 13 is a diagram showing other example calibration circuitry 1300. In the example of FIG. 13, the calibration circuitry 1300 includes a processor 1302 and memory 1306. The processor 1302 has a terminal 1304. The memory 1306 has a terminal 1308. As shown, the memory 1306 includes calibration instructions 1310.

In some examples, the processor 1302 operates to perform the operations of the drift calibration controller 1232 of FIG. 12 by executing the calibration instructions 1310. In other examples, the processor 1302 may operate to perform the operations of the calibration controller 138 in FIG. 1, the calibration controller 138A in FIG. 2, or the calibration controller 138B in FIG. 8 by executing the calibration instructions 1310. In still other examples, the processor 1302 may operate to perform the operations of the drift calibration controller 1232 in FIG. 12, the calibration controller 138 in FIG. 1, the calibration controller 138A in FIG. 2, and/or the calibration controller 138B in FIG. 8 by executing the calibration instructions 1310.

Figure 14:
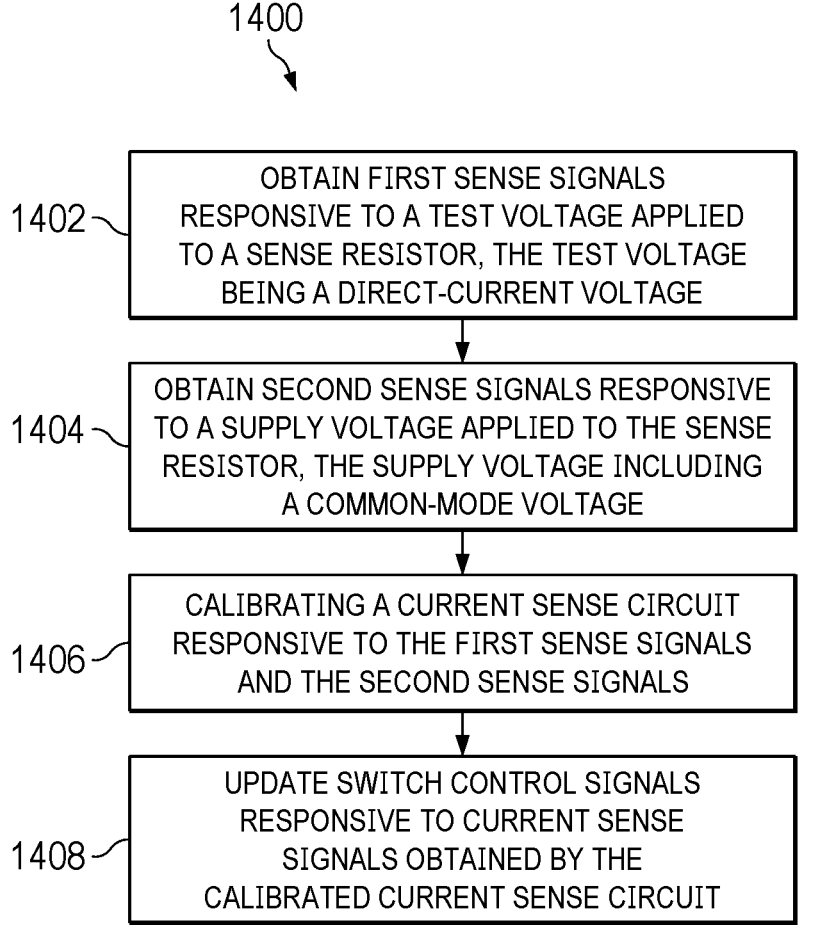
FIG. 14 is a diagram showing an example circuit control method.

FIG. 14 is a diagram showing an example circuit control method 1400. The method 1400 is performed, for example, by a circuit that includes the driver circuit 102, the test circuit 118, the current sense circuit 130, the calibration controller 138, and the switch controller 144 in FIG. 1. In some examples, the circuit performing the method 1400 may also include the calibration resistor RCAL, the drift sense circuit 802 in FIG. 8, and the drift calibration controller 1232 in FIG. 12. As shown, the method 1400 includes obtaining first sense signals (e.g., VTS1 and VTS2 in FIG. 2) responsive to a test voltage (e.g., VTEST herein) applied to a sense resistor (e.g., the sense resistor RSNS herein), the test voltage being a direct current (DC) voltage at block 1402. At block 1404, second sense signals are obtained responsive to a supply voltage (e.g., VDD herein) applied to the sense resistor, the supply voltage including a common-mode voltage. At block 1406, a current sense circuit is calibrated responsive to the first sense signals and the second sense signals. At block 1408, switch control signals are updated responsive to current sense signals obtained by the calibration current sense circuit.

In some examples, the method 1400 may include: determining an error due to the common-mode voltage responsive to the first sense results and the second sense results; and determining adjustments to first and second trimmable resistors of a ratiometric sense circuit responsive to the determined error. In some examples, the method 1400 may include: determining a resistance drift value for a calibration resistor separate from the sense resistor; adjusting a current sense gain value responsive to the determined resistance drift value.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field-effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:
a driver circuit having a first terminal, a second terminal, a third terminal, and a fourth terminal;
a test circuit having a first terminal, a second terminal, a third terminal, and a fourth terminal, the first terminal of the test circuit coupled to the third terminal of the driver circuit, and the second terminal of the test circuit coupled to the fourth terminal of the driver circuit;

a sense resistor having a first terminal and a second terminal, the first terminal of the sense resistor coupled to the fourth terminal of the driver circuit;

a current sense circuit having a first terminal, a second terminal, a third terminal, a fourth terminal, and a fifth terminal, the first terminal of the current sense circuit coupled to the first terminal of the sense resistor, the second terminal of the current sense circuit coupled to the second terminal of the sense resistor;

a calibration controller having a first terminal, a second terminal, and a third terminal, the first terminal of the calibration controller coupled to the fourth terminal of the current sense circuit, the second terminal of the calibration controller coupled to the fourth terminal of the test circuit, the third terminal of the calibration controller coupled to the third terminal of the current sense circuit; and a switch controller having a first terminal and a second terminal, the first terminal of the switch controller coupled to the fifth terminal of the current sense circuit, and the second terminal of the switch controller coupled to the first terminal of the driver circuit.

2. The circuit of claim 1, wherein the current sense circuit includes an operational amplifier having a terminal, a resistor having a first terminal and a second terminal, and a trimmable resistor having a first terminal and a second terminal, the first terminal of the resistor coupled to the first terminal of the current sense circuit, the second terminal of the resistor coupled to the terminal of the operational amplifier, and the first terminal of the trimmable resistor coupled to the terminal of the operational amplifier.

3. The circuit of claim 2, wherein the operational amplifier has a second terminal, the current sense circuit includes an analog-to-digital converter (ADC) having a first terminal and a second terminal, the first terminal of the ADC is coupled to the second terminal of the operational amplifier, and the second terminal of the ADC is coupled to the fourth terminal of the current sense circuit.

4. The circuit of claim 2, wherein the terminal of the operational amplifier is a first terminal, the operational amplifier has a second terminal, the resistor is a first resistor, and the current sense circuit includes a second resistor having a first terminal and a second terminal, the first terminal of the second resistor coupled to the first terminal of the operational amplifier, and the second terminal of the resistor is coupled to the second terminal of the operational amplifier.

5. The circuit of claim 1, wherein the current sense circuit includes an operational amplifier having a first terminal and a second terminal, a first resistor having a first terminal and a second terminal, a second resistor having a first terminal and a second terminal, a first trimmable resistor having a first terminal and a second terminal, and a second trimmable resistor having a first terminal and a second terminal, the first terminal of the first resistor coupled to the first terminal of the current sense circuit, the second terminal of the first resistor coupled to the first terminal of the operational amplifier, the first terminal of the second resistor coupled to the second terminal of the current sense circuit, the second terminal of the second resistor coupled to the second terminal of the operational amplifier, the first terminal of the first trimmable resistor coupled to the first terminal of the operational amplifier, and the first terminal of the second trimmable resistor coupled to the second terminal of the operational amplifier.

6. The circuit of claim 1, wherein the calibration controller includes:

an operational amplifier having a first terminal, a second terminal, and a third terminal;

gate control logic having a first terminal and a second terminal, the first terminal of the gate control logic coupled to the second terminal of the operational amplifier, and the second terminal of the gate control logic coupled to the second terminal of the calibration controller; and a trim controller having a first terminal and second terminal, the first terminal of the trim controller coupled to the third terminal of the operational amplifier, and the second terminal of the trim controller coupled to the third terminal of the calibration controller.

7. The circuit of claim 1, wherein the test circuit includes a first transistor and a second transistor, the first transistor having a first terminal, a second terminal, and a control terminal, the second transistor having a first terminal, a second terminal, and a control terminal, the first terminals of the first and second transistors coupled to the third terminal of the test circuit, the second terminal of the first transistor coupled to the first terminal of the test circuit, the second terminal of the second transistor coupled to the second terminal of the test circuit, and the control terminals of the first and second transistors coupled to the fourth terminal of the test circuit.

8. The circuit of claim 1, further comprising a calibration resistor and a drift sense circuit having a first terminal, a second terminal, and a third terminal, the first terminal of the calibration resistor coupled to the first terminal of the drift sense circuit, and the second terminal of the calibration resistor coupled to the second terminal of the drift sense circuit.

9. The circuit of claim 8, wherein the drift sense circuit includes a ratiometric measurement circuit, and the circuit further comprises a drift calibration controller coupled to the drift sense circuit and configured to:

obtain division results by dividing a first sense result from the ratiometric circuit by a second sense result from the ratiometric circuit;

obtain averaged division results by averaging multiple samples of division results;

estimate drift results for the sense resistor responsive to the averaged division results and initial division results; and adjust a current sense gain responsive to drive results.

10. The circuit of claim 9, wherein the drift calibration controller includes a processor and a memory coupled to the processor, the memory storing calibration instructions that, when executed, cause the processor to:

obtain division results by dividing a first sense result from the ratiometric circuit by a second sense result from the ratiometric circuit;

obtain averaged division results by averaging multiple samples of division results;

estimate drift results for the sense resistor responsive to the averaged division results and initial division results; and adjust a current sense gain responsive to drive results.

11. The circuit of claim 1, wherein the test circuit is configured to receive a direct-current (DC) voltage at its first terminal.

12. The circuit of claim 11, wherein the calibration controller is further configured to perform a binary search to determine a multi-bit trim code for a trimmable resistor of the current sense circuit, the binary search limited to a portion of the multi-bit trim code.

\* \* \* \* \*